United States Patent
Kuroyanagi

(10) Patent No.: US 10,903,819 B2
(45) Date of Patent: Jan. 26, 2021

(54) COMMUNICATION MODULE

(71) Applicant: TAIYO YUDEN CO., LTD., Tokyo (JP)

(72) Inventor: Takuma Kuroyanagi, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 16/418,058

(22) Filed: May 21, 2019

(65) Prior Publication Data

US 2020/0028491 A1    Jan. 23, 2020

(30) Foreign Application Priority Data

Jul. 17, 2018 (JP) .................................. 2018-134454

(51) Int. Cl.
| | | |
|---|---|---|
| *H03H 9/54* | (2006.01) | |
| *H03H 9/64* | (2006.01) | |
| *H03H 9/72* | (2006.01) | |
| *H03H 9/05* | (2006.01) | |
| *H03H 9/02* | (2006.01) | |
| *H04B 11/00* | (2006.01) | |
| *H04L 5/14* | (2006.01) | |

(52) U.S. Cl.
CPC ...... *H03H 9/6483* (2013.01); *H03H 9/02559* (2013.01); *H03H 9/02992* (2013.01); *H03H 9/058* (2013.01); *H03H 9/6489* (2013.01); *H03H 9/725* (2013.01); *H04B 11/00* (2013.01); *H04L 5/14* (2013.01)

(58) Field of Classification Search
CPC .......... H03H 9/05; H03H 9/0566; H03H 9/10; H03H 9/54; H03H 9/58; H03H 9/64; H03H 9/72

USPC ....................................................... 333/133
See application file for complete search history.

(56) References Cited

U.S. PATENT DOCUMENTS

| | | | | |
|---|---|---|---|---|
| 7,378,922 B2 | 5/2008 | Kubo et al. | ................... | 333/189 |
| 7,511,595 B2* | 3/2009 | Park | ........................ | H03H 3/04 |
| | | | | 333/133 |
| 8,294,535 B2* | 10/2012 | Feiertag | ................. | H03H 9/059 |
| | | | | 333/187 |
| 8,723,621 B2* | 5/2014 | Kidoh | .................. | H03H 9/1064 |
| | | | | 333/133 |
| 8,836,449 B2* | 9/2014 | Pang | .................... | H03H 9/0571 |
| | | | | 333/187 |

(Continued)

FOREIGN PATENT DOCUMENTS

| | | |
|---|---|---|
| JP | 2007-67617 A | 3/2007 |
| JP | 2017-157922 A | 9/2017 |

*Primary Examiner* — Dean O Takaoka
(74) *Attorney, Agent, or Firm* — Stein IP, LLC

(57) ABSTRACT

A communication module includes: a first substrate having a first surface; a second substrate having a second surface, the second surface facing the first surface across an air gap; a first filter located on the first surface, a passband of the first filter being either one of a transmit band and a receive band of a first band, the first band being a frequency division duplex band; and a second filter located on the second surface, at least a part of the second filter overlapping with at least a part of the first filter in a stacking direction in which the first substrate and the second substrate are stacked, a passband of the second filter being at least one of a transmit band and a receive band of a second band, the second band differing from the first band.

13 Claims, 27 Drawing Sheets

(56) References Cited

U.S. PATENT DOCUMENTS

| | | | |
|---|---|---|---|
| 2010/0045145 A1* | 2/2010 | Tsuda | H03H 9/1085 |
| | | | 310/365 |
| 2015/0123744 A1* | 5/2015 | Nishimura | H03H 9/1007 |
| | | | 333/133 |
| 2016/0134308 A1* | 5/2016 | Schmidhammer | H04B 1/0057 |
| | | | 370/277 |
| 2016/0301382 A1* | 10/2016 | Iwamoto | H03H 9/0552 |
| 2017/0250669 A1 | 8/2017 | Kuroyanagi et al. | 9/59 |

* cited by examiner

FIG. 16

| FILTER | SIGNAL | IS USED FOR B1/B3 CA? | IS USED FOR B2/B4 CA? | STACK? |
|---|---|---|---|---|
| FT3 | B3Tx (B4Tx, B66Tx) | Yes | Yes | No |
| FR2 | B3Rx | Yes | No | Yes |
| FT2 | B25Tx (B2Tx) | No | Yes | |
| FR1 | B25Rx (B2Rx) | No | Yes | Yes |
| FT1 | B1Tx | Yes | No | |
| FR3 | B66Rx (B1Rx, B4Rx) | Yes | Yes | No |

COMMUNICATION MODULE

CROSS-REFERENCE TO RELATED APPLICATION

This application is based upon and claims the benefit of priority of the prior Japanese Patent Application No. 2018-134454, filed on Jul. 17, 2018, the entire contents of which are incorporated herein by reference.

FIELD

A certain aspect of the present invention relates to a communication module.

BACKGROUND

There has been known a structure in which a substrate on which a transmit filter for a certain band is located and another substrate on which a receive filter for the certain band is located face each other across an air gap as disclosed in, for example, Japanese Patent Application Publication Nos. 2007-67617 and 2017-157922 (hereinafter, referred to as Patent Documents 1 and 2, respectively).

SUMMARY OF THE INVENTION

According to a first aspect of the present invention, there is provided a communication module including: a first substrate having a first surface; a second substrate having a second surface, the second surface facing the first surface across an air gap; a first filter located on the first surface, a passband of the first filter being either one of a transmit band and a receive band of a first band, the first band being a frequency division duplex band; and a second filter located on the second surface, at least a part of the second filter overlapping with at least a part of the first filter in a stacking direction in which the first substrate and the second substrate are stacked, a passband of the second filter being at least one of a transmit band and a receive band of a second band, the second band differing from the first band.

According to a second aspect of the present invention, there is provided a communication module including: a first filter located on a first surface; and a second filter located on a second surface, the second surface facing the first surface across an air gap, at least a part of the second filter overlapping with at least a part of the first filter in a stacking direction in which the first surface and the second surface are stacked, the second filter being not used for communication at the same time as the first filter.

BRIEF DESCRIPTION OF THE DRAWINGS

FIG. 16 presents filters used when carrier aggregation is conducted in the second embodiment;

DETAILED DESCRIPTION

When the transmit filter and the receive filter face each other as in Patent Document 2, the size is reduced. However, when the transmit filter and the receive filter for the same band face each other across an air gap, the transmit filter and the receive filter interfere with each other. Thus, the isolation characteristic deteriorates.

Hereinafter, a description will be given of embodiments of the present invention with reference to the accompanying drawings. The bands described hereinafter are frequency bands supporting the LTE standard (E-UTRA operating band).

First Embodiment

Figure 1:
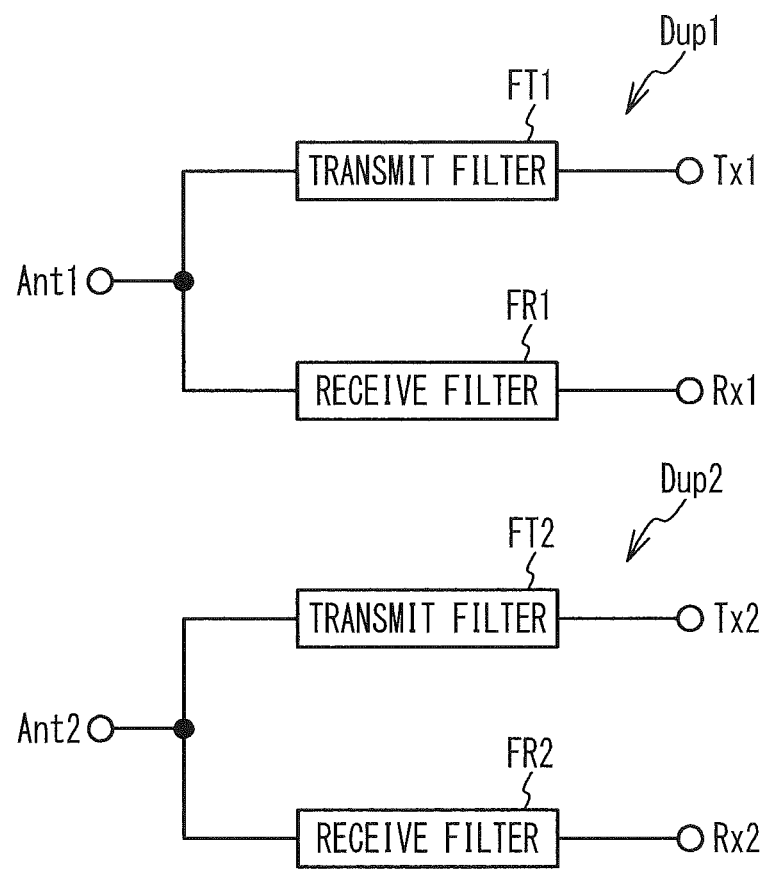
FIG. 1 is a block diagram of a communication module in accordance with a first embodiment.

FIG. 1 is a block diagram of a communication module in accordance with a first embodiment. As illustrated in FIG. 1, the communication module of the first embodiment includes a duplexer Dup1 for a first band and a duplexer Dup2 for a second band.

The duplexer Dup1 includes a transmit filter FT1 and a receive filter FR1. The transmit filter FT1 is connected between a common terminal Ant1 and a transmit terminal Tx1, and the receive filter FR1 is connected between the common terminal Ant1 and a receive terminal Rx1. The transmit filter FT1 transmits high-frequency signals in the transmit band of the first band to the common terminal Ant1 among high-frequency signals input from the transmit terminal Tx1, and suppresses high-frequency signals in other bands. The receive filter FR1 transmits high-frequency signals in the receive band of the first band to the receive terminal Rx1 among high-frequency signals input from the common terminal Ant1, and suppresses high-frequency signals in other bands.

The duplexer Dup2 includes a transmit filter FT2 and a receive filter FR2. The transmit filter FT2 is connected between a common terminal Ant2 and a transmit terminal Tx2, and the receive filter FR2 is connected between the common terminal Ant2 and a receive terminal Rx2. The transmit filter FT2 transmits high-frequency signals in the transmit band of the second band to the common terminal Ant2 among high-frequency signals input from the transmit terminal Tx2, and suppresses high-frequency signals in other bands. The receive filter FR2 transmits high-frequency signals in the receive band of the second band to the receive terminal Rx2 among high-frequency signals input from the common terminal Ant2, and suppresses high-frequency signals in other bands.

The first band differs from the second band, and is a frequency division duplex (FDD) band. In the FDD system, reception of a reception signal and transmission of a transmission signal are conducted at the same time. The first band is, for example, Band1 (transmit band: 1920 MHz to 1980 MHz, receive band: 2110 MHz to 2170 MHz) or Band66 (transmit band: 1710 MHz to 1780 MHz, receive band: 2110 MHz to 2200 MHz). The second band is, for example, Band3 (transmit band: 1710 MHz to 1785 MHz, receive band: 1805 MHz to 1880 MHz).

The first band may be, for example, Band2 (transmit band: 1850 MHz to 1910 MHz, receive band: 1930 MHz to 1990 MHz), and the second band may be, for example, Band4 (transmit band: 1710 MHz to 1755 MHz, receive band: 2110 MHz to 2155 MHz).

Figure 2:
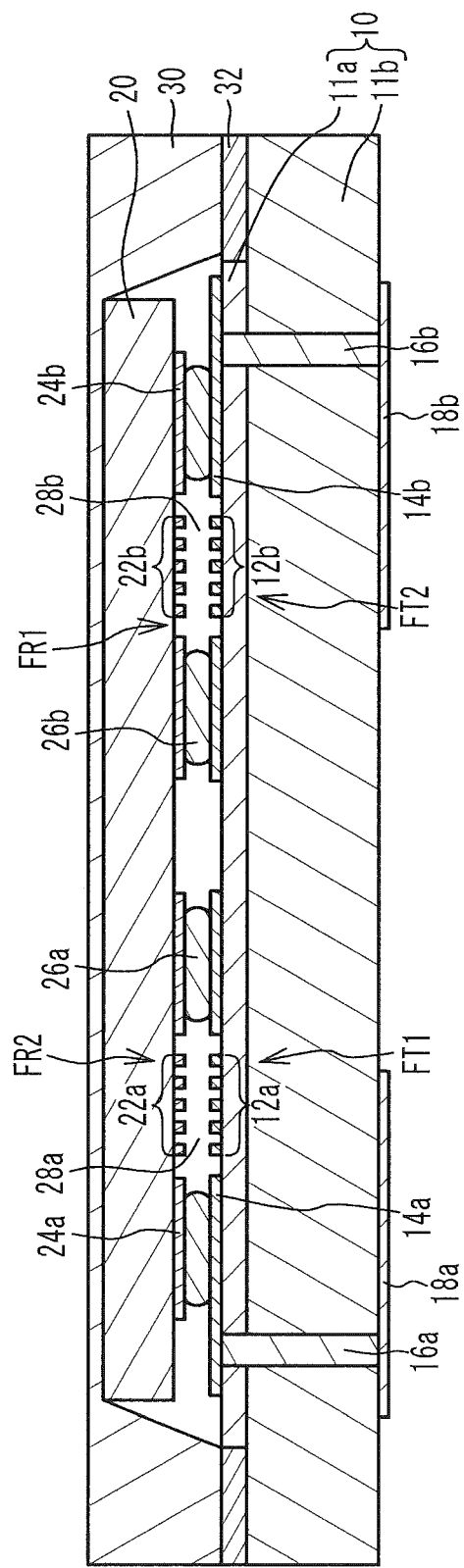
FIG. 2 is a cross-sectional view of the communication module in accordance with the first embodiment.

FIG. 2 is a cross-sectional view of the communication module in accordance with the first embodiment. As illustrated in FIG. 2, a substrate 20 is mounted on a substrate 10. The substrate 10 includes a support substrate 11b and a piezoelectric substrate 11a. The support substrate 11b is, for example, a sapphire substrate, a spinel substrate, an alumina substrate, a crystal substrate, or a silicon substrate. The piezoelectric substrate 11a is, for example, a lithium tantalate substrate or a lithium niobate substrate. The piezoelectric substrate 11a is bonded on the upper surface of the support substrate 11b. The bonded face between the piezoelectric substrate 11a and the support substrate 11b is a planar surface, and flat.

Acoustic wave resonators 12a and 12b and wiring lines 14a and 14b are located on the upper surface of the substrate 10. The acoustic wave resonators 12a and the wiring lines 14a form the transmit filter FT1, and the acoustic wave resonators 12b and the wiring lines 14b form the transmit filter FT2. Terminals 18a and 18b are located on the lower surface of the substrate 10. The terminals 18a and 18b are foot pads for connecting the acoustic wave resonators 12a, 12b, 22a, and 22b to external devices. Via wirings 16a and 16b are provided so as to penetrate through the substrate 10. The via wirings 16a and 16b electrically connect the wiring lines 14a and 14b to the terminals 18a and 18b, respectively. The wiring lines 14a and 14b, the via wirings 16a and 16b, and the terminals 18a and 18b are formed of a metal layer such as, but not limited to, a copper layer, an aluminum layer, or a gold layer. The terminals 18a and 18b include the common terminals Ant1 and Ant2, the transmit terminals Tx1 and Tx2, the receive terminals Rx1 and Rx2, and ground terminals.

Acoustic wave resonators 22a and 22b and wiring lines 24a and 24b are located on the lower surface of the substrate 20. The acoustic wave resonators 22a and the wiring lines 24a form the receive filter FR2, and the acoustic wave resonators 22b and the wiring lines 24b form the receive filter FR1. The substrate 20 is a piezoelectric substrate such as, but not limited to, a lithium tantalate substrate or a lithium niobate substrate. The wiring lines 24a and 24b are formed of a metal layer such as, but not limited to, a copper layer, an aluminum layer, or a gold layer. The wiring lines 14a and 14b of the substrate 10 and the wiring lines 24a and 24b of the substrate 20 are connected through bumps 26a and 26b, respectively. The upper surface of the substrate 10 and the lower surface of the substrate 20 face each other across air gaps 28a and 28b.

The piezoelectric substrate 11a in the periphery of the substrate 10 is removed, and a ring-shaped electrode 32 is provided instead. A sealing portion 30 is located on the substrate 10 so as to surround the substrate 20. The sealing portion 30 is bonded with the ring-shaped electrode 32. The sealing portion 30 is formed of, for example, a metal such as solder or an insulating material such as resin.

Figure 3A:
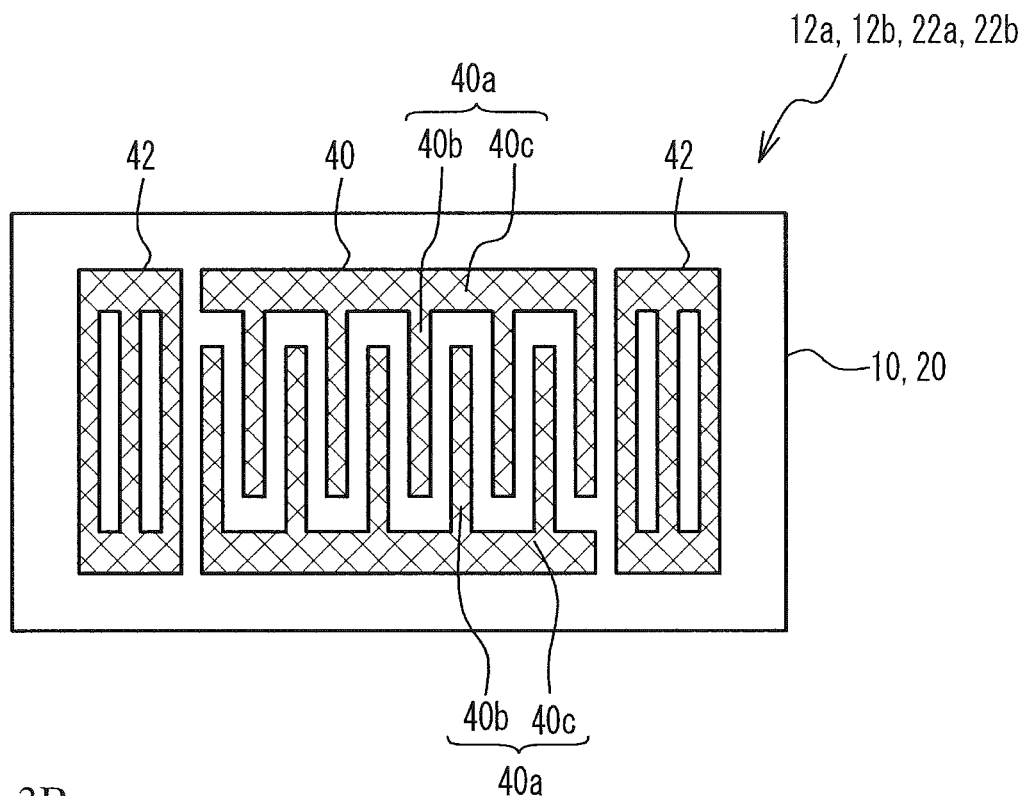
FIG. 3A is a plan view of an exemplary acoustic wave resonator in the first embodiment.

FIG. 3A is a cross-sectional view of an exemplary acoustic wave resonator in the first embodiment. FIG. 3A illustrates a case where the acoustic wave resonators 12a, 12b, 22a, and 22b are surface acoustic wave resonators. An interdigital transducer (IDT) 40 and reflectors 42 are formed on the substrate 10 or 20. The IDT 40 includes a pair of comb-shaped electrodes 40a facing each other. Each of the comb-shaped electrodes 40a includes a plurality of electrode fingers 40b, and a bus bar 40c connecting the electrode fingers 40b. The reflectors 42 are located at both sides of the IDT 40. The IDT 40 excites a surface acoustic wave on the substrate 10. The IDT 40 and the reflectors 42 are formed of, for example, an aluminum film or a copper film. A protective film or a temperature compensation film may be provided on the substrate 10 or 20 so as to cover the IDT 40 and the reflectors 42. The substrates 10 and 20 may be a composite substrate in which the piezoelectric substrate 11a is bonded on the support substrate 11b as with the substrate 10 in FIG. 2. The substrates 10 and 20 may be a piezoelectric substrate as with the substrate 20 in FIG. 2.

Figure 3B:
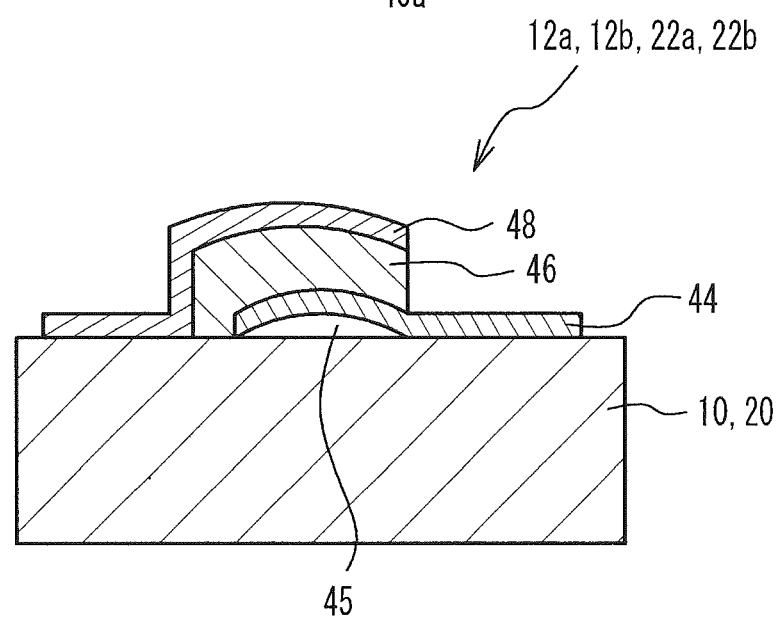
FIG. 3B is a cross-sectional view of another exemplary acoustic wave resonator in the first embodiment.

FIG. 3B illustrates a case where the acoustic wave resonators 12a, 12b, 22a, and 22b are piezoelectric thin film resonators. A piezoelectric film 46 is located on the substrate 10 or 20. A lower electrode 44 and an upper electrode 48 are located so as to sandwich the piezoelectric film 46. An air gap 45 is formed between the lower electrode 44 and the substrate 10 or 20. The region where the lower electrode 44 and the upper electrode 48 face each other across at least a part of the piezoelectric film 46 is a resonance region. The lower electrode 44 and the upper electrode 48 in the resonance region excite an acoustic wave in the thickness extension mode in the piezoelectric film 46. The substrate 10 or 20 is, for example, a sapphire substrate, a spinel substrate, an alumina substrate, a glass substrate, a crystal substrate, or a silicon substrate. The lower electrode 44 and the upper electrode 48 are formed of a metal film such as, but not limited to, a ruthenium film. The piezoelectric film 46 is, for example, an aluminum nitride film. The acoustic wave resonators 12a, 12b, 22a, and 22b include electrodes that excite an acoustic wave. Thus, so as not to disturb the excitation of the acoustic wave, the acoustic wave resonators 12a, 12b, 22a, and 22b are covered with the air gaps 28a and 28b.

Figure 4:
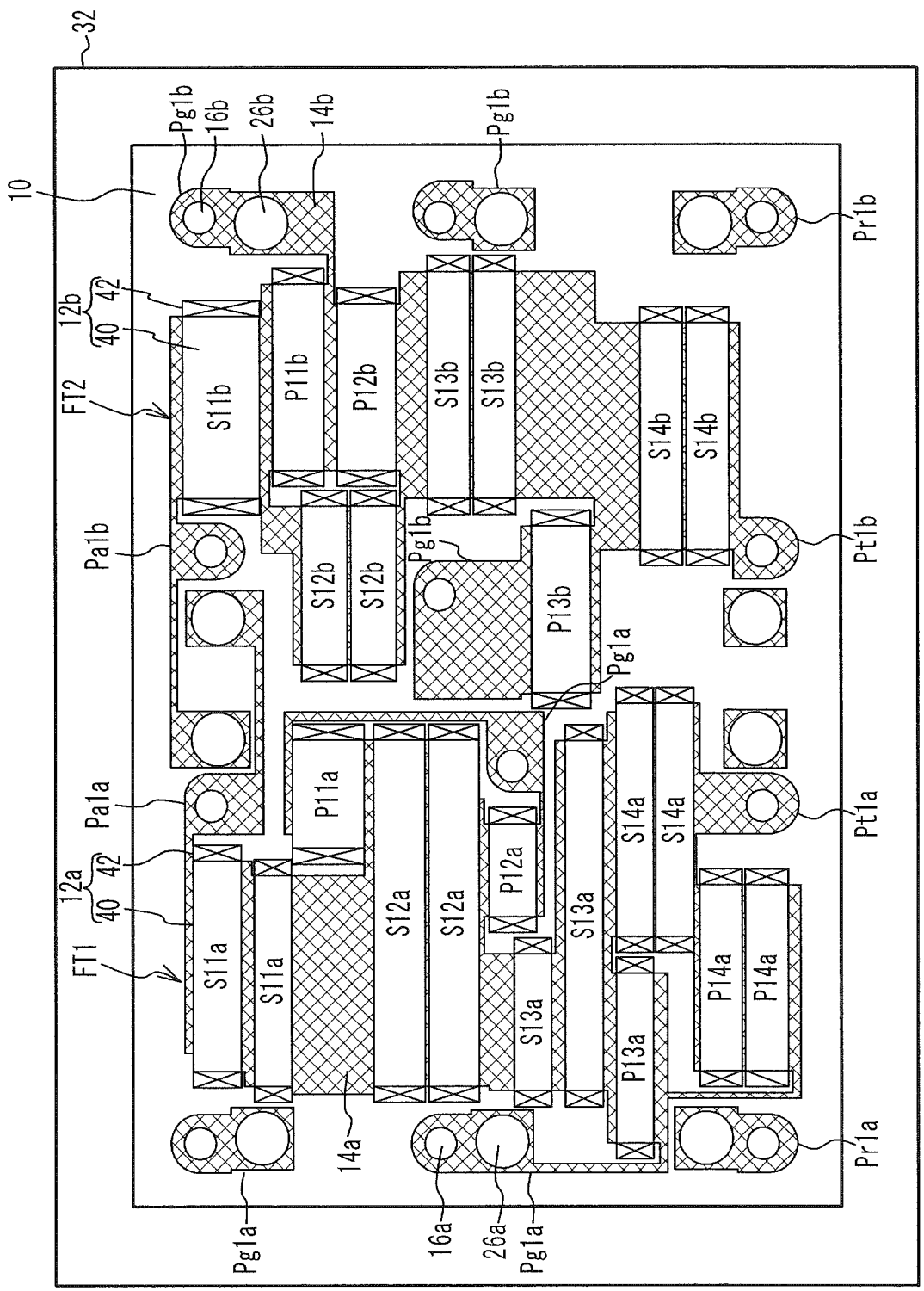
FIG. 4 is a plan view of the upper surface of a substrate 10 in the first embodiment.

FIG. 4 is a plan view of the upper surface of the substrate 10 in the first embodiment. As illustrated in FIG. 4, the acoustic wave resonators 12a and 12b, the wiring lines 14a and 14b, and the ring-shaped electrode 32 are located on the upper surface of the substrate 10. The via wiring 16a and the bump 26a are coupled to the wiring line 14a, and the via wiring 16b and the bump 26b are coupled to the wiring line 14b.

The wiring lines 14a form pads Pa1a, Pt1a, Pr1a, and Pg1a. Series resonators S11a through S14a are connected in series between the pads Pa1a and Pt1a through the wiring lines 14a, and parallel resonators P11a through P14a are connected in parallel between the pads Pa1a and Pt1a through the wiring lines 14a. First ends of the parallel resonators P11a through P14a are coupled to the pads Pg1a to which a ground potential is supplied. The series resonators S11a through S14a and the parallel resonators P11a through P14a form the transmit filter FT1 that is a ladder-type filter.

The wiring lines 14b form pads Pa1b, Pt1b, Pr1b, and Pg1b. Series resonators S11b through S14b are connected in series between the pads Pa1b and Pt1b through the wiring lines 14b, and parallel resonators P11b through P13b are connected in parallel between the pads Pa1b and Pt1b through the wiring lines 14b. First ends of the parallel resonators P11b through P13b are coupled to the pads Pg1b to which a ground potential is supplied. The series resonators S11b through S14b and the parallel resonators P11b through P13b form the transmit filter FT2 that is a ladder-type filter.

Figure 5:
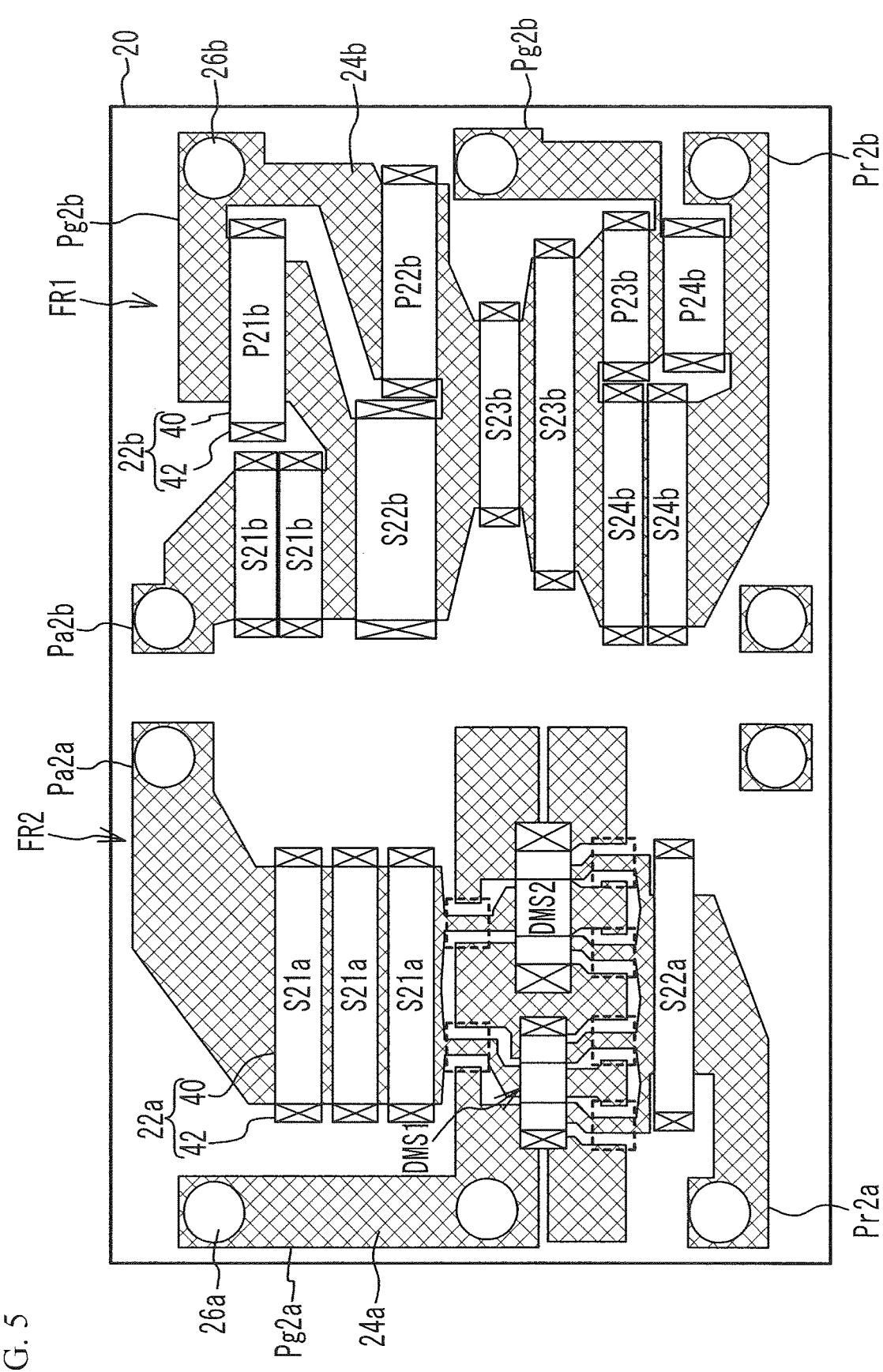
FIG. 5 is a plan view of the lower surface of a substrate 20 in the first embodiment as transparently viewed from above.

FIG. 5 is a plan view of the lower surface of the substrate 20 in the first embodiment as transparently viewed from above. As illustrated in FIG. 5, the acoustic wave resonators 22a and 22b and the wiring lines 24a and 24b are located on the lower surface of the substrate 20. The bumps 26a are coupled to the wiring lines 24a, and the bumps 26b are coupled to the wiring lines 24b.

The wiring lines 24a form pads Pa2a, Pr2a, and Pg2a. Series resonators S21a and S22a are connected in series between the pads Pa2a and Pr2a, and multimode type filters DMS1 and DMS2 are connected in parallel between the series resonators S21a and S22a. First ends of the IDTs in the DMS1 and the DMS2 are coupled to the pads Pg2a to which a ground potential is supplied. The dotted line overlapping with the wiring lines 24a coupled to the ground terminals of the DMS1 and the DMS2 represent aerial wiring lines that intersect with the signal wiring lines of the DMS1 and the DMS2. The series resonators S21a and S22a and the multimode type filters DMS1 and DMS2 form the receive filter FR2.

The wiring lines 24b form pads Pa2b, Pr2b, and Pg2b. Series resonators S21b through S24b are connected in series between the pads Pa2b and Pr2b through the wiring lines 24b, and parallel resonators P21b through P24b are connected in parallel between the pads Pa2b and Pr2b through the wiring lines 24b. First ends of the parallel resonators P21b through P24b are coupled to the pads Pg2b to which a ground potential is supplied. The series resonators S21b through S24b and the parallel resonators P21b through P24b form the receive filter FR1 that is a ladder-type filter.

The pad Pa1a of the transmit filter FT1 is electrically connected to the pad Pa2b of the receive filter FR1 by a bump, and the pad Pa1b of the transmit filter FT2 is electrically connected to the pad Pa2a of the receive filter FR2 by a bump.

Figure 6:
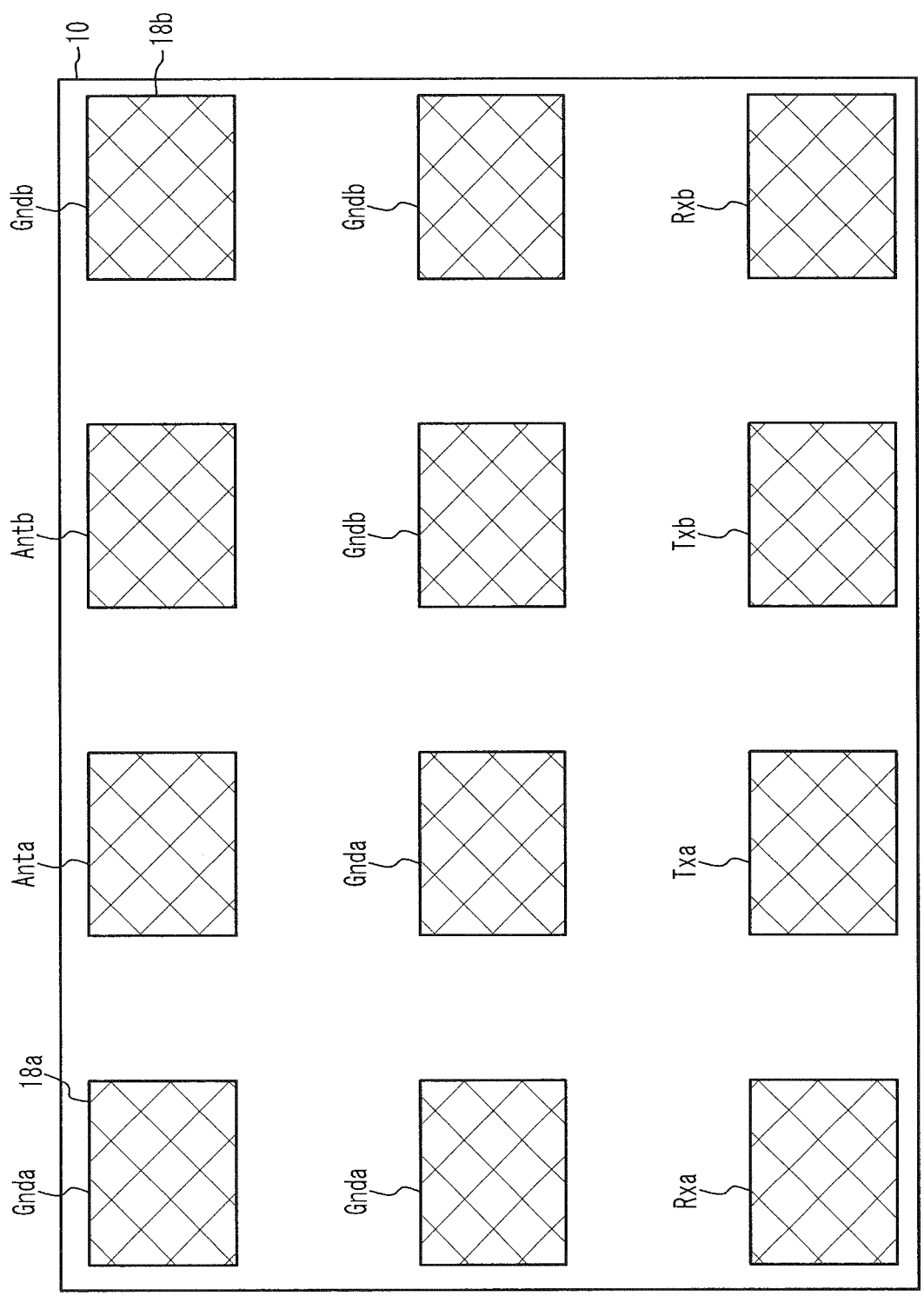
FIG. 6 is a plan view of the lower surface of the substrate 10 in the first embodiment as transparently viewed from above.

FIG. 6 is a plan view of the lower surface of the substrate 10 in the first embodiment as transparently viewed from above. As illustrated in FIG. 6, the terminals 18a and 18b are located on the lower surface of the substrate 10. The terminals 18a include a common terminal Anta, a transmit terminal Txa, a receive terminal Rxa, and ground terminals Gnda. The common terminal Anta is electrically connected to the pad Pa1a through the via wiring 16a, and is electrically connected to the pad Pa2b through the bump 26a. The transmit terminal Txa is electrically connected to the pad Pt1a through the via wiring 16a. The receive terminal Rxa is electrically connected to the pad Pr2a through the via wiring 16a, the pad Pr1a, and the bump 26a. The ground terminal Gnda is electrically connected to the pad Pg1a through the via wiring 16a, and is electrically connected to the pad Pg2a through the bump 26a.

The terminals 18b include a common terminal Antb, a transmit terminal Txb, a receive terminal Rxb, and a ground terminal Gndb. The common terminal Antb is electrically connected to the pad Pa1b through the via wiring 16b, and is electrically connected to the pad Pa2a through the bump 26b. The transmit terminal Txb is electrically connected to the pad Pt1b through the via wiring 16b. The receive terminal Rxb is electrically connected to the pad Pr2b through the via wiring 16b, the pad Pr1b, and the bump 26b. The ground terminal Gndb is electrically connected to the pad Pg1b through the via wiring 16b, and is electrically connected to the pad Pg2b through the bump 26b.

The common terminal Ant1, the transmit terminal Tx1, and the receive terminal Rx1 in FIG. 1 correspond to the common terminal Anta, the transmit terminal Txa, and the receive terminal Rxb, respectively. The common terminal Ant2, the transmit terminal Tx2, and the receive terminal Rx2 in FIG. 1 correspond to the common terminal Antb, the transmit terminal Txb, and the receive terminal Rxa, respectively.

In the first embodiment, as illustrated in FIG. 4 and FIG. 5, the transmit filter FT1 of the duplexer Dup1 and the receive filter FR2 of the duplexer Dup2 face each other across the air gap 28a, and the transmit filter FT2 of the duplexer Dup2 and the receive filter FR1 of the duplexer Dup1 face each other across the air gap 28b.

First Comparative Example

Figure 7:
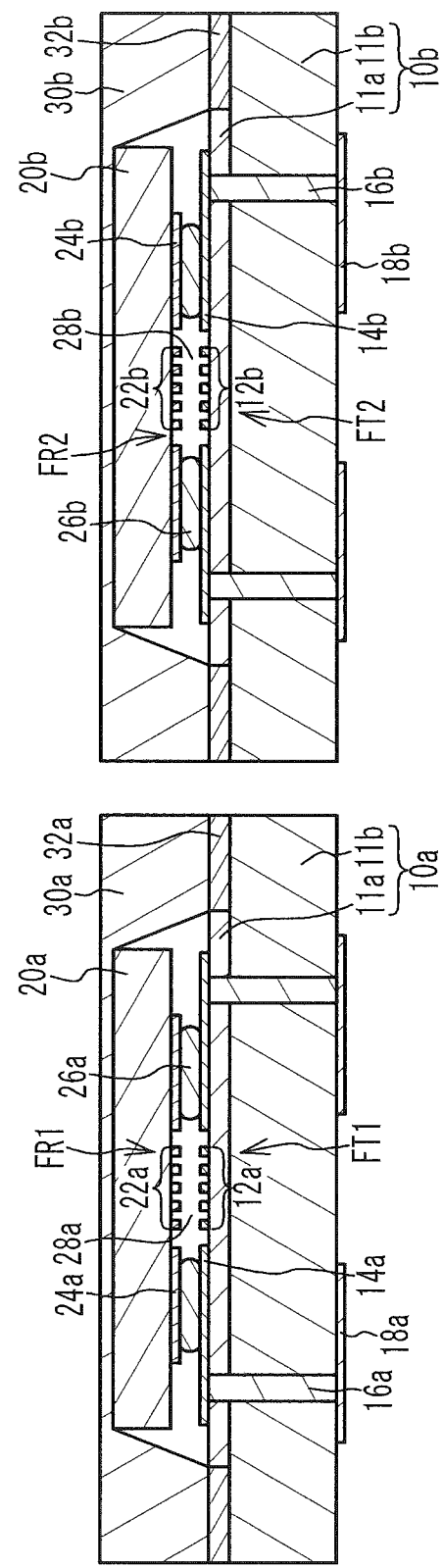
FIG. 7 is a cross-sectional view of a communication module in accordance with a first comparative example.

FIG. 7 is a cross-sectional view of a communication module in accordance with a first comparative example. As illustrated in FIG. 7, in the first comparative example, a substrate 20a is mounted on a substrate 10a, and a substrate 20b is mounted on a substrate 10b. Each of the substrates 10a and 10b has a structure having the piezoelectric substrate 11a bonded on the support substrate 11b. A ring-shaped electrode 32a is located in the periphery of the substrate 10a, and a ring-shaped electrode 32b is located in the periphery of the substrate 10b. A sealing portion 30a that surrounds the substrate 20a and is bonded with the ring-shaped electrode 32a is located on the substrate 10a, and a sealing portion 30b that surrounds the substrate 20b and is bonded with the ring-shaped electrode 32b is located on the substrate 10b.

The acoustic wave resonators 12a and the wiring lines 14a located on the upper surface of the substrate 10a form the transmit filter FT1, and the acoustic wave resonators 12b and the wiring lines 14b located on the upper surface of the substrate 10b form the transmit filter FT2. The acoustic wave resonators 22a and the wiring lines 24a located on the lower surface of the substrate 20a form the receive filter FR1, and the acoustic wave resonators 22b and the wiring lines 24b located on the lower surface of the substrate 20b form the receive filter FR2.

In the first comparative example, the transmit filter FT1 and the receive filter FR1 of the duplexer Dup1 face each other across the air gap 28a. The transmit filter FT2 and the receive filter FR2 of the duplexer Dup2 face each other across the air gap 28b. Thus, the transmit filter FT1 and the receive filter FR1 interfere with each other, and for example, signals in the receive band of the first band input to the transmit terminal Tx1 leaks to the receive terminal Rx1. Accordingly, the isolation characteristic of the duplexer Dup1 deteriorates. Similarly, the isolation characteristic of the duplexer Dup2 deteriorates.

On the other hand, in the first embodiment, the transmit filter FT1 and the receive filter FR1 of the duplexer Dup1 do not face each other, and the transmit filter FT2 and the receive filter FR2 of the duplexer Dup2 do not face each other. Accordingly, the isolation characteristics of the duplexers Dup1 and Dup2 are improved.

In particular, Band1 (or Band66) and Band3 are bands of which communications are not executed at the same time (i.e., carrier aggregation is not conducted). Thus, the interference between the transmit filter FT1 and the receive filter FR2 and the interference between the transmit filter FT2 and the receive filter FR1 are unlikely to become a problem.

In addition, when the ground terminals of two filters are connected, the interference between the two filters tends to occur through the ground terminals. When the interference between the transmit filter FT1 and the receive filter FR2 and the interference between the transmit filter FT2 and the receive filter FR1 are unlikely to become a problem, the transmit filter FT1 and the receive filter FR2 can share a ground terminal, and the transmit filter FT2 and the receive filter FR1 can share a ground terminal. Thus, the size reduction is possible. For example, the ground pad Pg2a of the receive filter FR2 in FIG. 5 is coupled, through the bump 26a, to the ground pad Pg1a coupled to the parallel resonators P13a and P14a of the transmit filter FT1 in FIG. 4. The ground pad Pg2b coupled to the parallel resonators P21b and P22b of the receive filter FR1 in FIG. 5 is coupled, through the bump 26b, to the ground pad Pg1b coupled to the parallel resonators P11b and P12b of the transmit filter FT2 in FIG. 4.

First Variation of the First Embodiment

Figure 8:
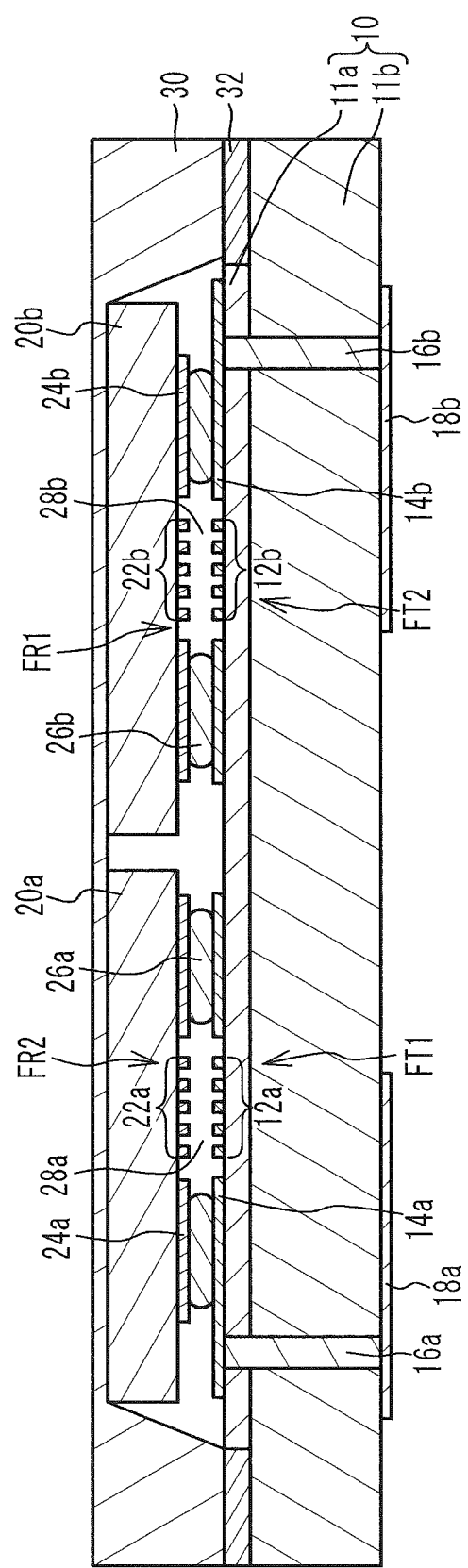
FIG. 8 is a cross-sectional view of a communication module in accordance with a first variation of the first embodiment.
Figure 9:
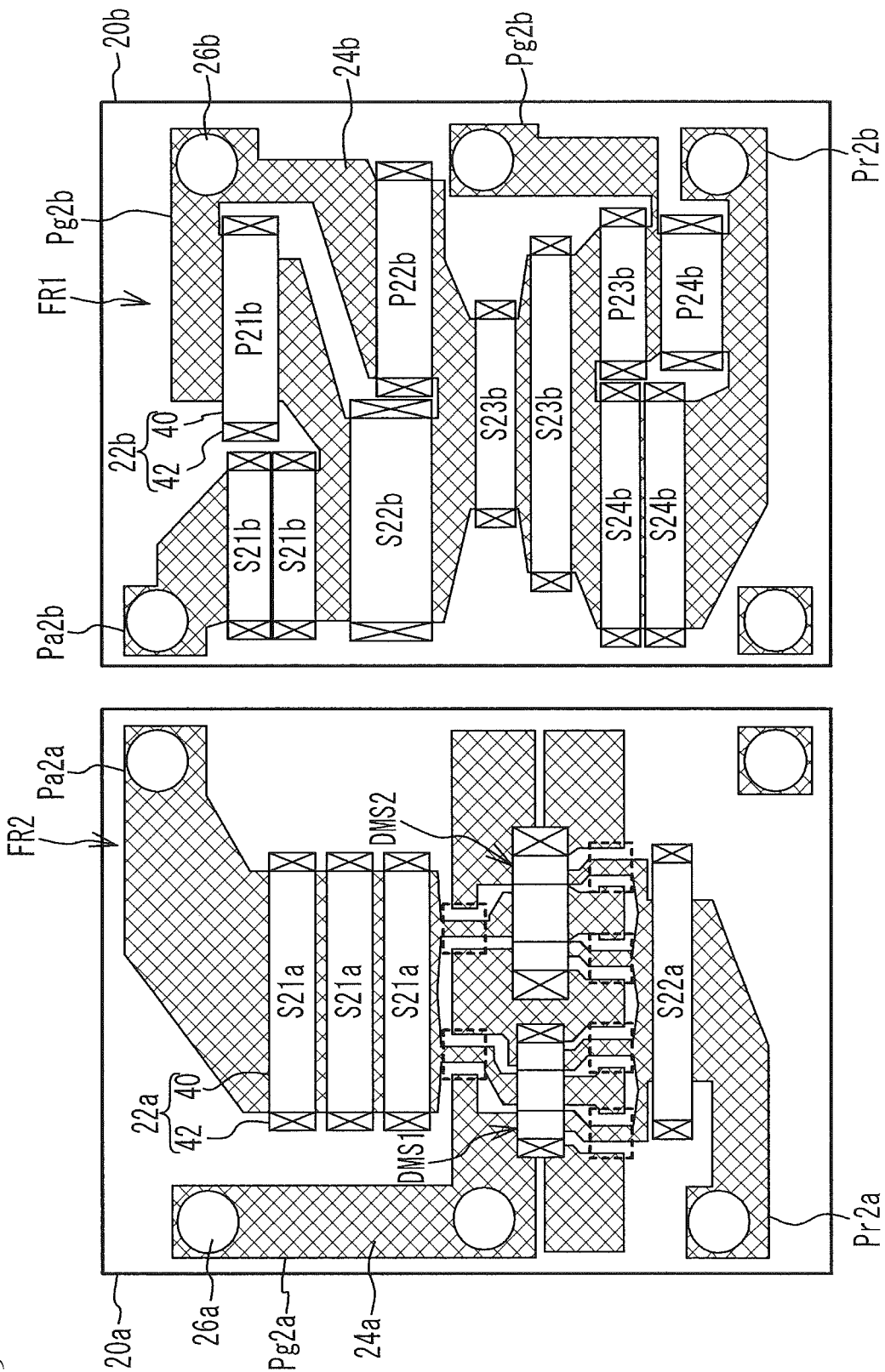
FIG. 9 is a plan view of the lower surface of substrates 20a and 20b of the communication module in accordance with the first variation of the first embodiment as transparently viewed from above.

FIG. 8 is a cross-sectional view of a communication module in accordance with a first variation of the first embodiment. FIG. 9 is a plan view of the lower surfaces of the substrates 20a and 20b of the communication module in accordance with the first variation of the first embodiment as transparently viewed from above. As illustrated in FIG. 8 and FIG. 9, the substrates 20a and 20b are mounted on the substrate 10. The receive filter FR2 is located on the lower surface of the substrate 20a, and the receive filter FR1 is located on the lower surface of the substrate 20b. Other structures are the same as those of the first embodiment, and the description thereof is thus omitted. As in the first variation of the first embodiment, the receive filters FR1 and FR2 may be located on the different substrates 20b and 20a.

Second Variation of the First Embodiment

Figure 10:
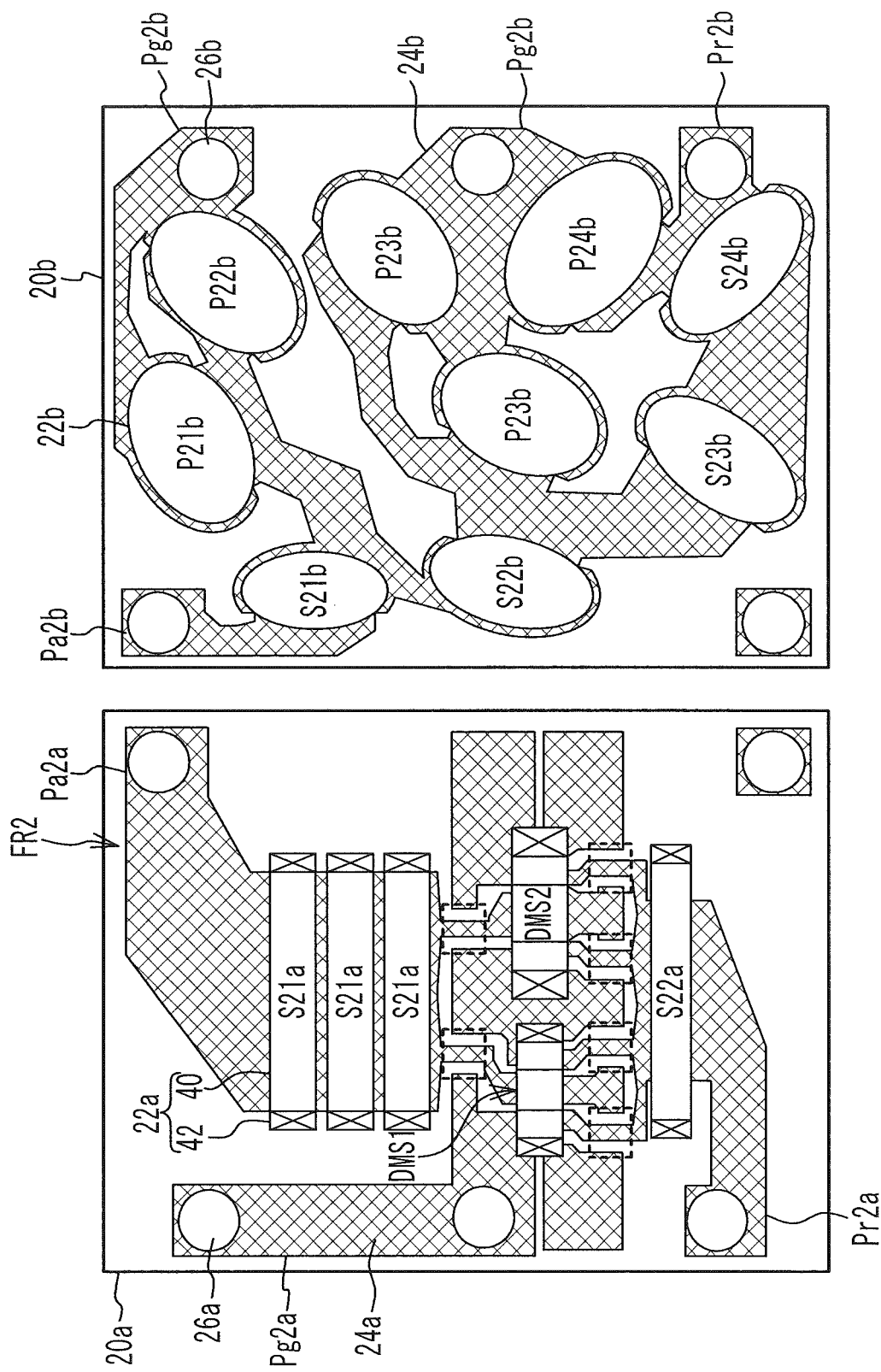
FIG. 10 is a plan view of the lower surfaces of the substrates 20a and 20b of a communication module in accordance with a second variation of the first embodiment as transparently viewed from above.

FIG. 10 is a plan view of the lower surfaces of the substrates 20a and 20b of a communication module in accordance with a second variation of the first embodiment as transparently viewed from above. As illustrated in FIG. 10, the acoustic wave resonator 22b is a piezoelectric thin film resonator. Other structures are the same as those of the first variation of the first embodiment, and the description thereof is thus omitted. As in the second variation of the first embodiment, at least one of the acoustic wave resonators 12a, 12b, 22a, and 22b may be a piezoelectric thin film resonator. At least one of the acoustic wave resonators 12a, 12b, 22a, and 22b may be a surface acoustic wave resonator.

Third Variation of the First Embodiment

Figure 11:
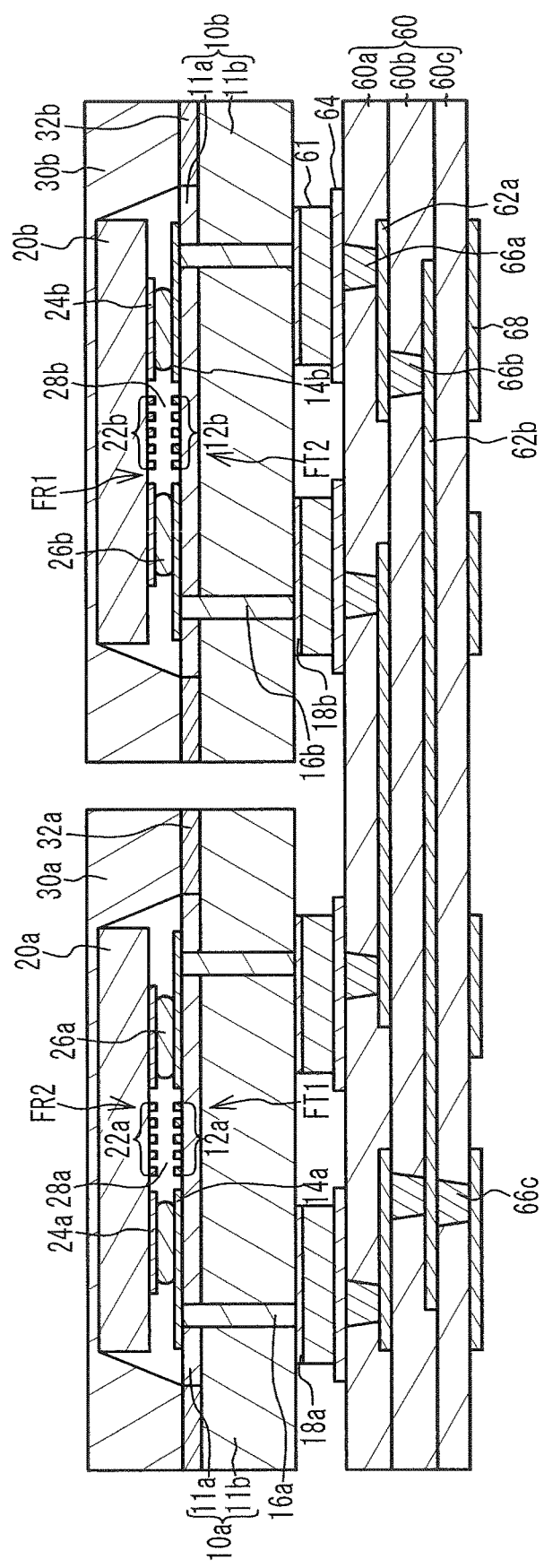
FIG. 11 is a cross-sectional view of a communication module in accordance with a third variation of the first embodiment.

FIG. 11 is a cross-sectional view of a communication module in accordance with a third variation of the first embodiment. The substrate 20a is mounted on the substrate 10a, and the substrate 20b is mounted on the substrate 10b. Each of the substrates 10a and 10b has a structure having the piezoelectric substrate 11a bonded on the support substrate 11b. The ring-shaped electrodes 32a and 32b are respectively located in the peripheries of the substrates 10a and 10b. The sealing portion 30a that surrounds the substrate 20a and is bonded with the ring-shaped electrode 32a is located on the substrate 10a, and the sealing portion 30b that surrounds the substrate 20b and is bonded with the ring-shaped electrode 32b is located on the substrate 10b.

The substrates 10a and 10b are mounted on a mount board 60 through solder 61. The mount board 60 includes a plurality of insulating layers 60a through 60c that are stacked. The insulating layers 60a through 60c are, for example, a resin layer or a ceramics layer. Electrodes 64 are located on the upper surface of the mount board 60, and terminals 68 are located on the lower surface of the mount board 60. Wiring lines 62a are located between the insulating layers 60a and 60b, and wiring lines 62b are located between the insulating layers 60b and 60c. Via wirings 66a through 66c respectively penetrating through the insulating layers 60a through 60c are provided. The terminal 68 is electrically connected to the electrode 64 through the via wirings 66a through 66c and the wiring lines 62a and 62b. The electrodes 64 are electrically connected to the terminals 18a and 18b by solder 61. Other structures are the same as those of the first embodiment, and the description thereof is thus omitted. As in the third variation of the first embodiment, the transmit filters FT1 and FT2 may be located on different substrates 10b and 10a.

Fourth Variation of the First Embodiment

Figure 12:
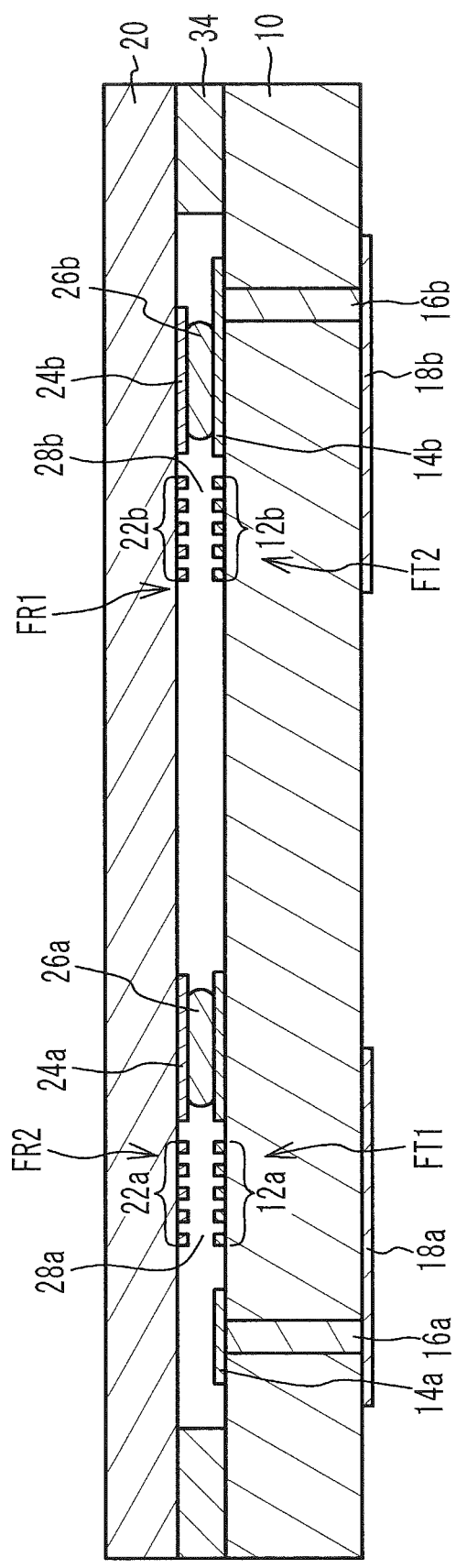
FIG. 12 is a cross-sectional view of a communication module in accordance with a fourth variation of the first embodiment.

FIG. 12 is a cross-sectional view of a communication module in accordance with a fourth variation of the first embodiment. As illustrated in FIG. 12, the substrates 10 and 20 have substantially identical planar shapes. A ring-shaped sealing layer 34 is located in the peripheries of the substrates 10 and 20. The substrates 10 and 20 are bonded through the ring-shaped sealing layer 34 and the bumps 26a and 26b. The ring-shaped sealing layer 34 seals the acoustic wave resonators 12a, 12b, 22a, and 22b in the air gaps 28a and 28b. Other structures are the same as those of the first embodiment, and the description thereof is thus omitted. As in the fourth variation of the first embodiment, instead of the sealing portion, the ring-shaped sealing layer 34 may be provided.

Fifth Variation of the First Embodiment

Figure 13A:
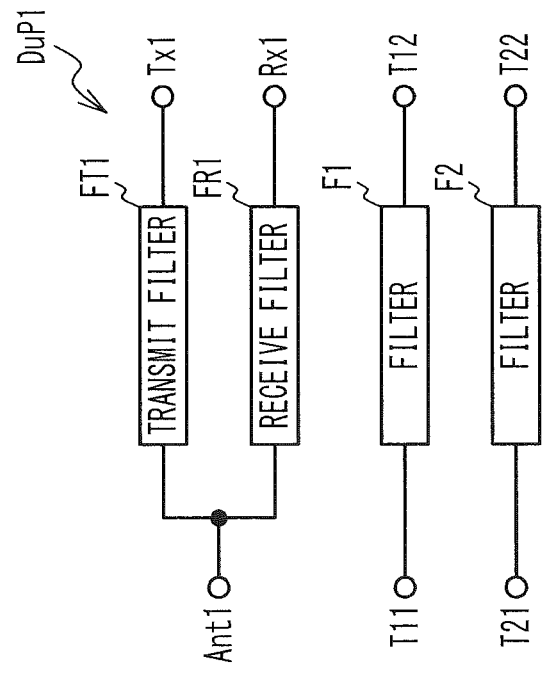
FIG. 13A is a block diagram of a communication module in accordance with a fifth variation of the first embodiment.
Figure 13B:
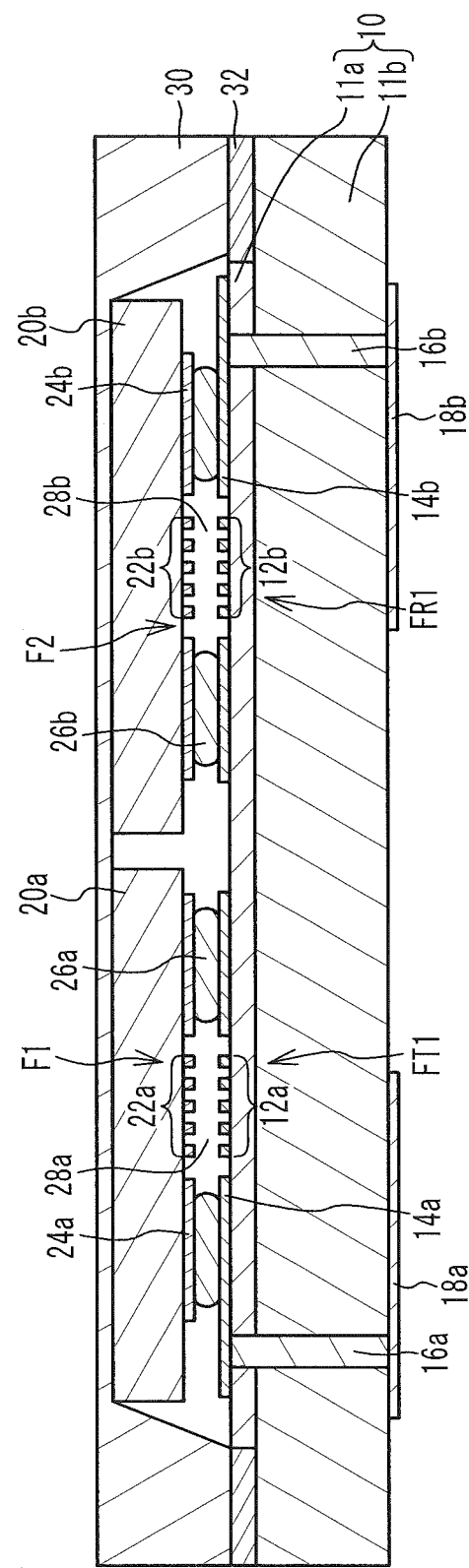
FIG. 13B is a cross-sectional view of the communication module in accordance with the fifth variation of the first embodiment.

FIG. 13A is a block diagram of a communication module in accordance with a fifth variation of the first embodiment, and FIG. 13B is a cross-sectional view of the communication module in accordance with the fifth variation of the first embodiment. As illustrated in FIG. 13A, the communication module includes the duplexer Dup1, and filters F1 and F2. The filter F1 is connected between terminals T11 and T12. The filter F2 is connected between terminals T21 and T22. The duplexer Dup1 is for an FDD band, and the filters F1 and F2 are for time division duplex (TDD) bands. In the TDD system, the transmit band and the receive band are the same band, and a transmission signal and a reception signal are time-divided. Thus, the filters F1 and F2 act as a transmit filter when a transmission signal is transmitted, and act as a receive filter when a reception signal is received. The duplexer Dup1 is for, for example, Band7 (transmit band: 2500 MHz to 2570 MHz, receive band: 2620 MHz to 2690 MHz), and the filters F1 and F2 are for, for example, Band40 (band: 2300 MHz to 2400 MHz) and Band41 (band: 2496 MHz to 2690 MHz), respectively.

As illustrated in FIG. 13B, the substrates 20a and 20b are mounted on the substrate 10. The transmit filter FT1 is formed of the acoustic wave resonators 12a and the wiring lines 14a, and the receive filter FR1 is formed of the acoustic wave resonators 12b and the wiring lines 14b. The filter F1 is formed of the acoustic wave resonators 22a and the wiring lines 24a, and the filters F2 are formed of the acoustic wave resonators 22b and the wiring lines 24b. The transmit filter FT1 and the filter F1 face each other across the air gap 28a, and the receive filter FR1 and the filter F2 face each other across the air gap 28b. Other structures are the same as those of the first variation of the first embodiment, and the description thereof is thus omitted.

As in the fifth variation of the first embodiment, the transmit filter FT1 and the receive filter FR1 may be located on the upper surface of the single substrate 10. In addition, the filter F1 facing the transmit filter FT1 and the filter F2 facing the receive filter FR1 may be filters for different bands.

Sixth Variation of the First Embodiment

Figure 14A:
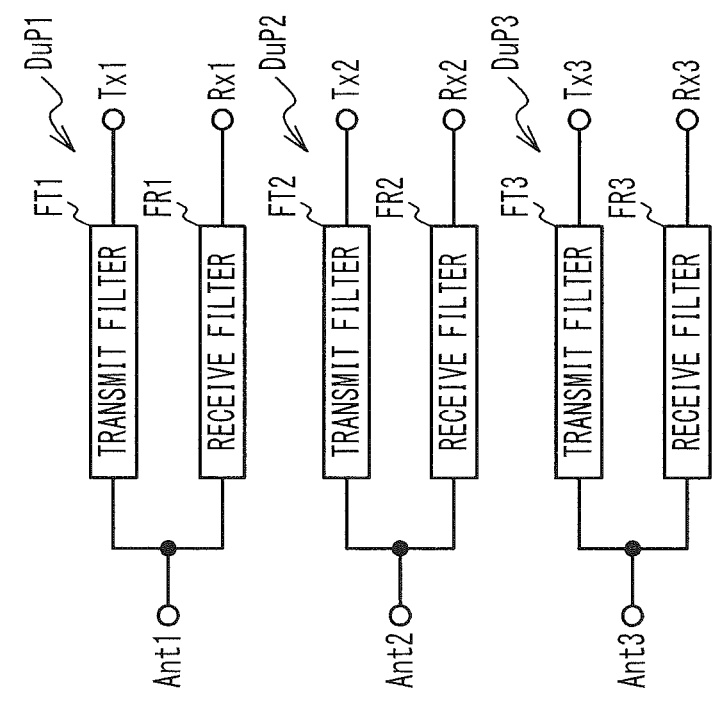
FIG. 14A is a block diagram of a communication module in accordance with a sixth variation of the first embodiment.
Figure 14B:
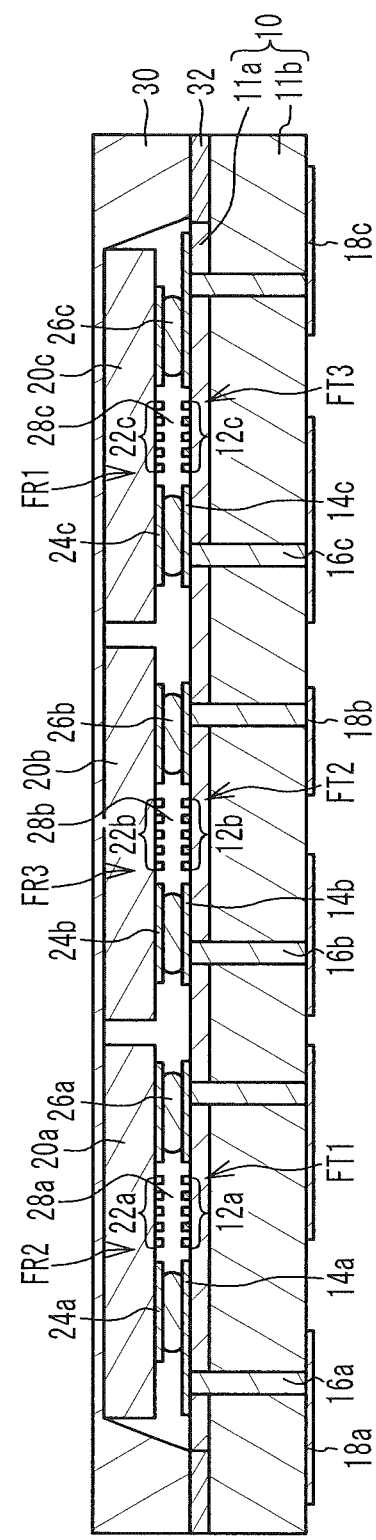
FIG. 14B is a cross-sectional view of the communication module in accordance with the sixth variation of the first embodiment.

FIG. 14A is a block diagram of a communication module in accordance with a sixth variation of the first embodiment, and FIG. 14B is a cross-sectional view of the communication module in accordance with the sixth variation of the first embodiment. As illustrated in FIG. 14A, the communication module includes duplexers Dup1, Dup2, and Dup3. The duplexers Dup1 and Dup2 are for the first band and the second band, respectively, and the structures of the duplexers Dup1 and Dup2 are the same as those of the first embodiment.

The duplexer Dup3 is for a third band different from the first band and the second band, and includes a transmit filter FT3 and a receive filter FR3. The transmit filter FT3 is connected between a common terminal Ant3 and a transmit terminal Tx3, and the receive filter FR3 is connected between the common terminal Ant3 and a receive terminal Rx3. The transmit filter FT3 transmits, to the common terminal Ant3, high-frequency signals in the transmit band of the third band input from the transmit terminal Tx3, and suppresses high-frequency signals in other bands. The receive filter FR3 transmits, to the receive terminal Rx3, high-frequency signals in the receive band of the third band input from the common terminal Ant3, and suppresses high-frequency signals in other bands.

The first band is, for example, Band25 (transmit band: 1850 MHz to 1915 MHz, receive band: 1930 MHz to 1995 MHz). The second band and the third band are, for example, Band3 and Band4, respectively.

As illustrated in FIG. 14B, substrates 20a through 20c are mounted on the substrate 10. The substrate 20c faces the substrate 10 across an air gap 28c. Acoustic wave resonators 12c and wiring lines 14c are located on the upper surface of the substrate 10, and terminals 18c are located on the lower surface of the substrate 10. Provided are via wirings 16c that penetrate through the substrate 10 and electrically connect the wiring lines 14c and the terminals 18c. Acoustic wave resonators 22c and wiring lines 24c are located on the lower surface of the substrate 20c. The wiring lines 14c and 24c are connected through a bump 26c.

The transmit filter FT1 is formed of the acoustic wave resonators 12a and the wiring lines 14a, the transmit filter FT2 is formed of the acoustic wave resonators 12b and the wiring lines 14b, and the transmit filter FT3 is formed of the acoustic wave resonators 12c and the wiring lines 14c. The receive filter FR1 is formed of the acoustic wave resonators 22c and the wiring lines 24c, the receive filter FR2 is formed of the acoustic wave resonators 22a and the wiring lines 24a, and the receive filter FR3 is formed of the acoustic wave resonators 22b and the wiring lines 24b. Other structures are the same as those of the first variation of the first embodiment, and the description thereof is thus omitted.

As in the sixth variation of the first embodiment, the communication module may include three or more duplexers. The guard band width between the transmit band and the receive band of the duplexer Dup1 is the narrowest among the guard band widths of the three duplexers Dup1 through Dup3. For example, the guard band width of Band25 is 15 MHz, the guard band width of Band3 is 20 MHz, and the guard band width of Band4 is 355 MHz. In the duplexer of which the band has a small guard band width, the isolation easily deteriorates. Thus, the distance between the transmit filter FT1 and the receive filter FR1 of the duplexer Dup1 for Band25, of which the guard band width is the narrowest among those of the duplexers Dup1 through Dup3, is configured to be longer than the distance between the transmit filter FT2 and the receive filter FR2 and the distance between the transmit filter FT3 and the receive filter FR3. This configuration improves the isolation characteristic in the duplexer Dup1.

In the first embodiment and the variations thereof, the upper surface (a first surface) of the substrate 10 or 10a (a first substrate) and the lower surface (a second surface) of the substrate 20 or 20a (a second substrate) face each other across the air gap 28a. The transmit filter FT1 (a first filter) is located on the upper surface of the substrate 10 or 10a, and the passband of the transmit filter FT1 is the transmit band of the first band that is a frequency division duplex (FDD)

band. The receive filter FR2 (a second filter) is located on the lower surface of the substrate 20 or 20a, and the passband of the receive filter FR2 is the receive band of the second band different from the first band. In the stacking direction in which the substrates 10 and 20 are stacked, at least a part of the transmit filter FT1 and at least a part of the receive filter FR2 do not overlap with each other. This structure improves the isolation characteristic of the multiplexer for the first band compared with the structure where the transmit filter FT1 and the receive filter FR1 for the first band overlap with each other.

The description "at least a part of a filter and at least a part of another filter overlap with each other in the stacking direction" means that at least a part of an acoustic wave resonator and at least a part of another acoustic wave resonator overlap with each other, at least a part of a wiring line having a first electric potential and at least a part of another wiring line having a second electric potential different from the first electric potential overlap with each other, and/or at least a part of an acoustic wave resonator and at least a part of a wiring line overlap with each other.

It is sufficient if the passband of the first filter is either one of the transmit band and the receive band of the first band, and the passband of the second filter is at least one of the transmit band and the receive band of the second band. The passband of the second filter may be the communication band of a TDD band as in, for example, the first variation of the first embodiment. In the TDD band, the transmit band and the receive band are the same communication band. The passband of the second filter may be the receive band of the band for receiving only.

The transmit filter FT1 and the receive filter FR2 are not used for communication at the same time. Thus, even when the transmit filter FT1 and the receive filter FR2 overlap in the stacking direction, the interference between the transmit filter FT1 and the receive filter FR2 is unlikely to become a problem.

Since the interference between the transmit filter FT1 and the receive filter FR2 is unlikely to become a problem, as illustrated in FIG. 4 and FIG. 5, at least a part of the ground terminal of the transmit filter FT1 and at least a part of the ground terminal of the receive filter FR2 can be electrically connected on at least one of the upper surface of the substrate 10 and the lower surface of the substrate 20. Therefore, the size of the chip is reduced.

As in the first embodiment and the first, second, fourth, and sixth variations thereof, the second band is a frequency division duplex band, and the second filter is the receive filter FR2 of which the passband is the receive band of the second band. The transmit filter FT2 (a third filter) of which the passband is the transmit band of the second band is located on the upper surface of the substrate 10, and does not overlap with the receive filter FR2 in the stacking direction. For this structure, the transmit filter FT2 and the receive filter FR2 for the second band do not overlap in the stacking direction, and the isolation characteristic of the multiplexer for the second band is thus improved.

Furthermore, in the first embodiment and the fourth variation thereof, the receive filter FR1 (a fourth filter) of which the passband is the receive band of the first band is located on the lower surface of the substrate 20, at least a part of the receive filter FR1 overlaps with at least a part of the transmit filter FT2 in the stacking direction, and the receive filter FR1 and the transmit filter FT1 do not overlap with each other. This structure improves the isolation characteristics of the multiplexers for the first band and the second band, and reduces the size.

As in the first and sixth variations of the first embodiment, the receive filter FR1 may be located on the lower surface (a third surface) of the substrate 20b (a third substrate). This structure improves the isolation characteristics of the multiplexers for the first band and the second band, and reduces the size.

As in the fifth variation of the first embodiment, the receive filter FR1 (a third filter) of which the passband is the receive band of the first band is located on the upper surface of the substrate 10. In this structure, the transmit filter FT1 and the receive filter FR1 for the first band do not overlap in the stacking direction, and the isolation characteristic of the multiplexer for the first band is thus improved.

As in the third variation of the first embodiment, the lower surface (a third surface) of the substrate 20b (a third substrate) and the upper surface (a fourth surface) of the substrate 10b (a fourth substrate) face each other across the air gap 28b. The receive filter FR1 (a third filter) of which the passband is the receive band of the first band is located on the lower surface of the substrate 20b. The transmit filter FT2 (a fourth filter) of which the passband is the transmit band of the second band is located on the upper surface of the substrate 10b. In the stacking direction, at least a part of the receive filter FR1 overlaps with at least a part of the transmit filter FT2. This structure improves the isolation characteristics of the multiplexers for the first band and the second band, and reduces the size.

Second Embodiment

Figure 15:
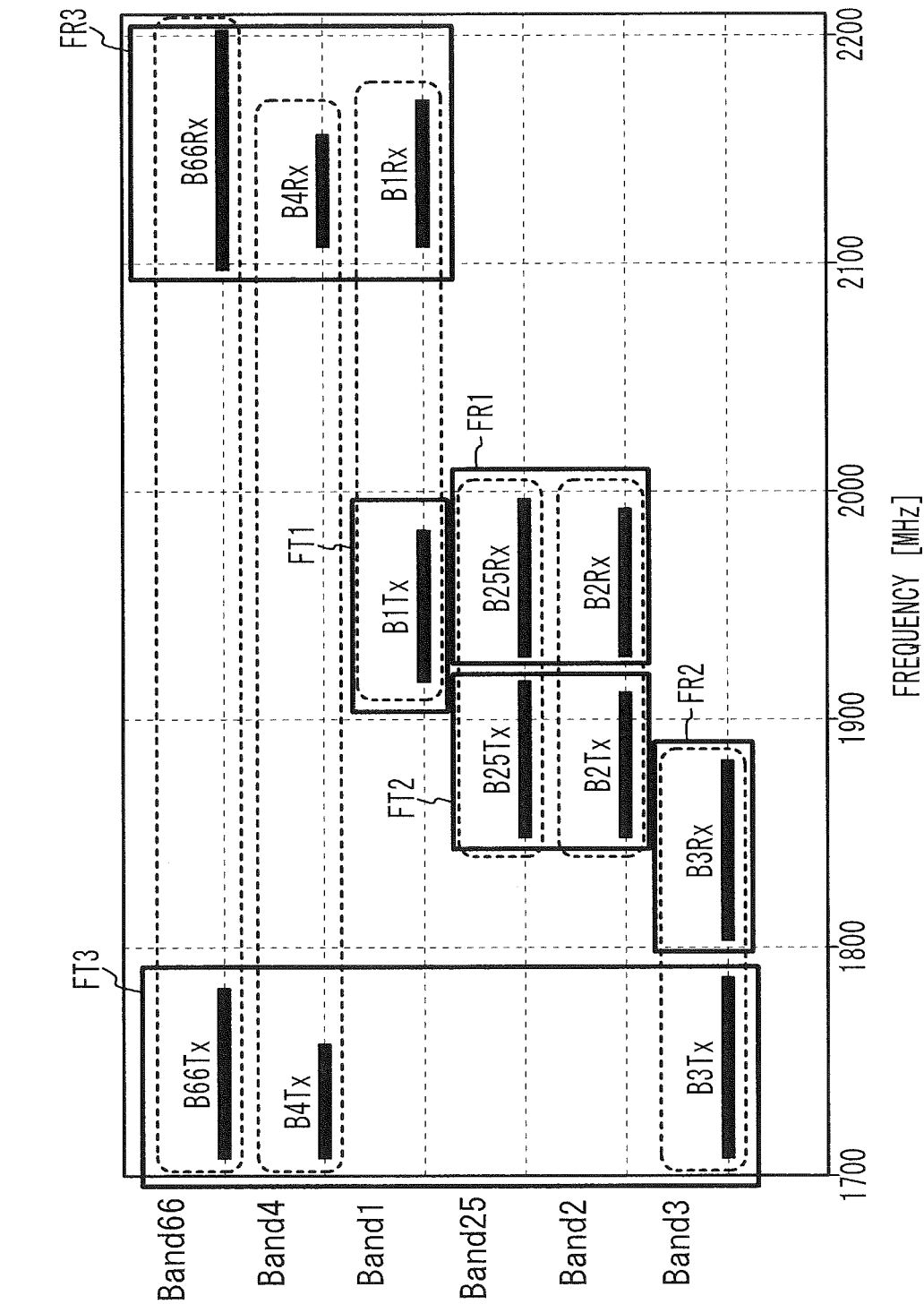
FIG. 15 presents the frequency of each band in a second embodiment.

FIG. 15 presents the frequency of each band in a second embodiment. The transmit band and the receive band of each of Band66, Band4, Band1, Band25, Band2, and Band3 are presented. As presented in FIG. 15, the transmit band B3Tx of Band3 includes the transmit band B4Tx of Band4 and the transmit band B66Tx of Band66. Thus, the transmit filter for Band3 can be used as the transmit filters for Band4 and Band66. Accordingly, the transmit filter for Band3 is also used for Band4 and Band66, and is defined as the transmit filter FT3. The user can select which of Band3, Band4, and Band66 the transmit filter FT3 is to be used for. The transmit band B25Tx of Band25 includes the transmit band B2Tx of Band2. Thus, the transmit filter for Band25 is also used as the transmit filter for Band2, and is defined as the transmit filter FT2. The user can select which of Band25 and Band2 the transmit filter FT2 is to be used for. The transmit filter for Band1 having the transmit band B1Tx is defined as the transmit filter FT1.

The receive band B66Rx of Band66 includes the receive band B1Rx of Band1 and the receive band B4Rx of Band4. Thus, the receive filter for Band66 is also used for Band1 and Band4, and is defined as the receive filter FR3. The user can select which of Band66, Band1, and Band4 the receive filter FR3 is to be used for. The receive band B25Rx of Band25 includes the receive band B2Rx of Band2. Thus, the receive filter for Band25 is also used for Band2, and is defined as the receive filter FR1. The user can select which of Band25 and Band2 the receive filter FR1 is to be used for. The receive filter for Band3 having the receive band B3Rx is defined as the receive filter FR2.

FIG. 16 presents filters used when carrier aggregation is conducted in the second embodiment. In FIG. 16, the "FILTER" indicates the filters FT1 through FT3 and FR1 through FR3. The column of "SIGNAL" stores a signal the filter allows to pass therethrough. For example, the entry "B3Tx, (B4Tx, B66Tx)" represents a signal in the transmit band of Band3, Band4, or Band66. The entry "B3Rx" represents a signal in the receive band of Band3.

When a filter has a possibility to be used for carrier aggregation CA of Band1 and Band3, "Yes" is stored in the column of "IS USED FOR B1/B3 CA?", and when a filter has no possibility to be used for CA, "No" is stored. When a filter has a possibility to be used for CA of Band2 and Band4, "Yes" is stored in the column of "IS USED FOR B2/B4 CA?", and when a filter has no possibility to be used for CA, "No" is stored. Carrier aggregation CA means that signals of different bands are transmitted at the same time, and/or signals of different bands are received at the same time. For example, CA of Band1 and Band3 means that a signal of Band1 and a signal of Band3 are transmitted at the same time and/or a signal of Band3 and a signal of Band1 are received at the same time. CA of Band1 and Band3 and CA of Band2 and Band4 are never conducted at the same time.

When a filter may be stacked, "Yes" is stored in the column of "STACK?", and when a filter is preferably not stacked, "No" is stored. The term "stack" means that two filters are configured to face each other across the air gaps 28a through 28c in the first embodiment and the variations thereof. When filters facing each other across an air gap are used at the same time, signals interfere with each other. Thus, filters to be used at the same time are preferably not stacked. When a filter has a possibility to be used at the same time as any other filters, "No" is stored in the column of "STACK?". "Yes" is stored in the column of "STACK?" for filters that have no possibility to be used at the same time.

Since the transmit filter FT3 is used to transmit a signal of Band3, the transmit filter FT3 has a possibility to be used for CA of Band1 and Band3. Thus, "Yes" is stored in the column of "IS USED FOR B1B/B3 CA?". Since the transmit filter FT3 is used to transmit a signal of Band4, the transmit filter FT3 has a possibility to be used for CA of Band2 and Band4. Thus, "Yes" is stored in the column of "IS USED FOR B2/B4 CA?". Accordingly, the transmit filter FT3 has a possibility to be used at the same time as any of the filters FT1, FT2, and FR1 through FR3. Accordingly, "No" is stored in the column of "STACK?" for the transmit filter FT3, and the transmit filter FT3 is preferably stacked with none of other filters.

Since the receive filter FR2 is used for reception for Band3 only, the receive filter FR2 has a possibility to be used for CA of Band1 and Band3, and has no possibility to be used for CA of Band2 and Band4. Thus, for FR2, "Yes" is stored in the column of "IS USED FOR B1/B3 CA?" and "No" is stored in the column of "IS USED FOR B2/B4 CA?". The transmit filter FT2 has no possibility to be used for CA of Band1 and Band3, and has a possibility to be used for CA of Band2 and Band4. Thus, for the transmit filter FT2, "No" is stored in the column of "IS USED FOR B1/B3 CA?" and "Yes" is stored in the column of "IS USED FOR B2/B4 CA?". Thus, the receive filter FR2 and the transmit filter FT2 have no possibility to be used at the same time. Thus, "Yes" is stored in the column of "STACK?" for the receive filter FR2 and the transmit filter FT2 as indicated by hatching, and the filters FR2 and FT2 can be stacked. Similarly, the receive filter FR1 and the transmit filter FT1 can be stacked. The receive filter FR3 is preferably stacked with no filter.

Figure 17:
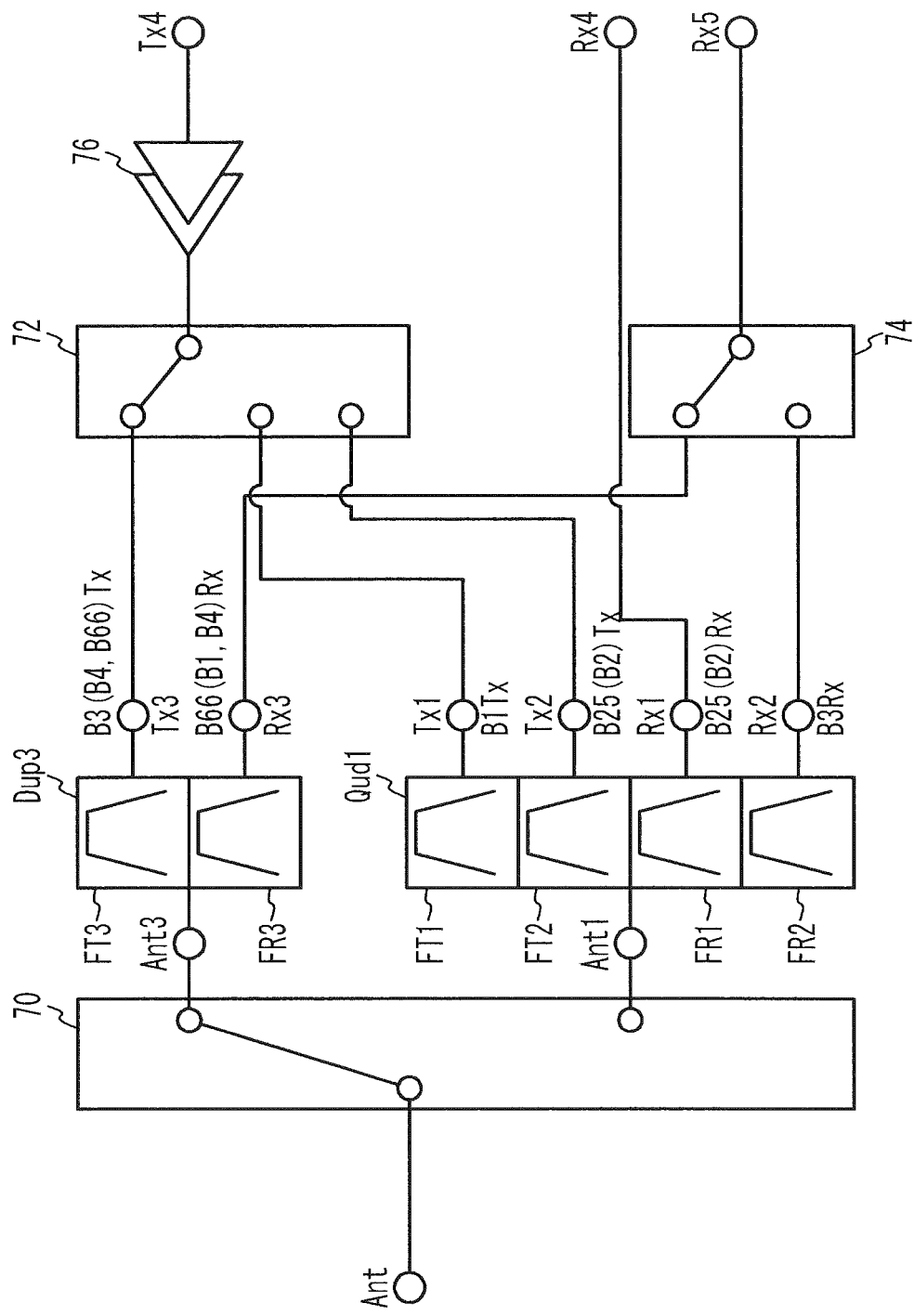
FIG. 17 is a block diagram of a communication module in accordance with the second embodiment.

FIG. 17 is a block diagram of a communication module in accordance with the second embodiment. As illustrated in FIG. 17, the module includes a quadplexer Qud1, a duplexer Dup3, switches 70, 72, and 74, and a power amplifier 76.

The quadplexer Qud1 includes the transmit filters FT1 and FT2 and the receive filters FR1 and FR2. The transmit filter FT1 is connected between the common terminal Ant1 and the transmit terminal Tx1. The transmit filter FT2 is connected between the common terminal Ant1 and the transmit terminal Tx2. The receive filter FR1 is connected between the common terminal Ant1 and the receive terminal Rx1. The receive filter FR2 is connected between the common terminal Ant1 and the receive terminal Rx2.

The duplexer Dup3 includes the transmit filter FT3 and the receive filter FR3. The transmit filter FT3 is connected between the common terminal Ant3 and the transmit terminal Tx3. The receive filter FR3 is connected between the common terminal Ant3 and the receive terminal Rx3.

The power amplifier 76 amplifies high-frequency signals input to the transmit terminal Tx4. The switch 70 selects at least one of the common terminals Ant1 and Ant3, and connects the selected common terminal to the antenna terminal Ant. The switch 72 selects at least one of the transmit terminals Tx1, Tx2, and Tx3, and connects the selected transmit terminal to the output terminal of the power amplifier 76. The switch 74 selects at least one of the receive terminals Rx2 and Rx3, and connects the selected receive terminal to the receive terminal Rx5. The receive terminal Rx1 is coupled to a receive terminal Rx4.

Figure 18:
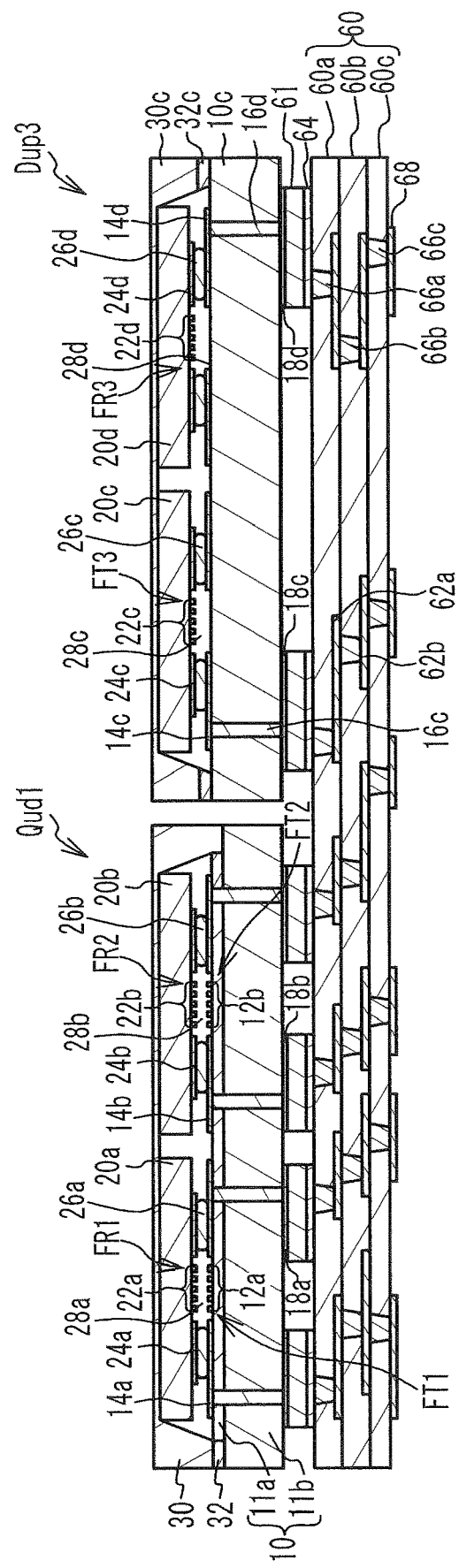
FIG. 18 is a cross-sectional view of the communication module in accordance with the second embodiment.

FIG. 18 is a cross-sectional view of the communication module in accordance with the second embodiment. As illustrated in FIG. 18, the quadplexer Qud1 and the duplexer Dup3 are mounted on the mount board 60. In the quadplexer Qud1, the transmit filters FT1 and FT2 are located on the upper surface of the substrate 10. The receive filter FR1 is located on the lower surface of the substrate 20a so as to face the transmit filter FT1 across the air gap 28a. The receive filter FR2 is located on the lower surface of the substrate 20b so as to face the transmit filter FT2 across the air gap 28b. The cross-section of the quadplexer Qud1 is the same as that of the first variation of the first embodiment illustrated in FIG. 8 except the above-described structures, and the description thereof is thus omitted.

In the duplexer Dup3, wiring lines 14c and 14d are located on the upper surface of the substrate 10c. Terminals 18c and 18d are located on the lower surface of the substrate 10c. The via wiring 16c electrically connects the wiring line 14c and the terminal 18c, and a via wiring 16d electrically connects the wiring line 14d and the terminal 18d. Substrates 20c and 20d are located on the substrate 10c. The acoustic wave resonators 22c and the wiring lines 24c are located on the lower surface of the substrate 20c. The acoustic wave resonators 22c and the wiring lines 24c form the transmit filter FT3. Acoustic wave resonators 22d and wiring lines 24d are located on the lower surface of the substrate 20d. The acoustic wave resonators 22d and the wiring lines 24d form the receive filter FR3. The wiring lines 14c and 24c are connected through the bump 26c, and the wiring lines 14d and 24d are connected through a bump 26d. A ring-shaped electrode 32c is located in the periphery of the substrate 10c. The transmit filter FT3 faces the substrate 10c across the air gap 28c, and the receive filter FR3 faces the substrate 10c across an air gap 28d. A sealing portion 30c is located so as to surround the substrates 20c and 20d and be bonded with the ring-shaped electrode 32c. The structure of the mount board 60 is the same as that of the mount board 60 of the third variation of the first embodiment, and the description thereof is thus omitted.

Figure 19:
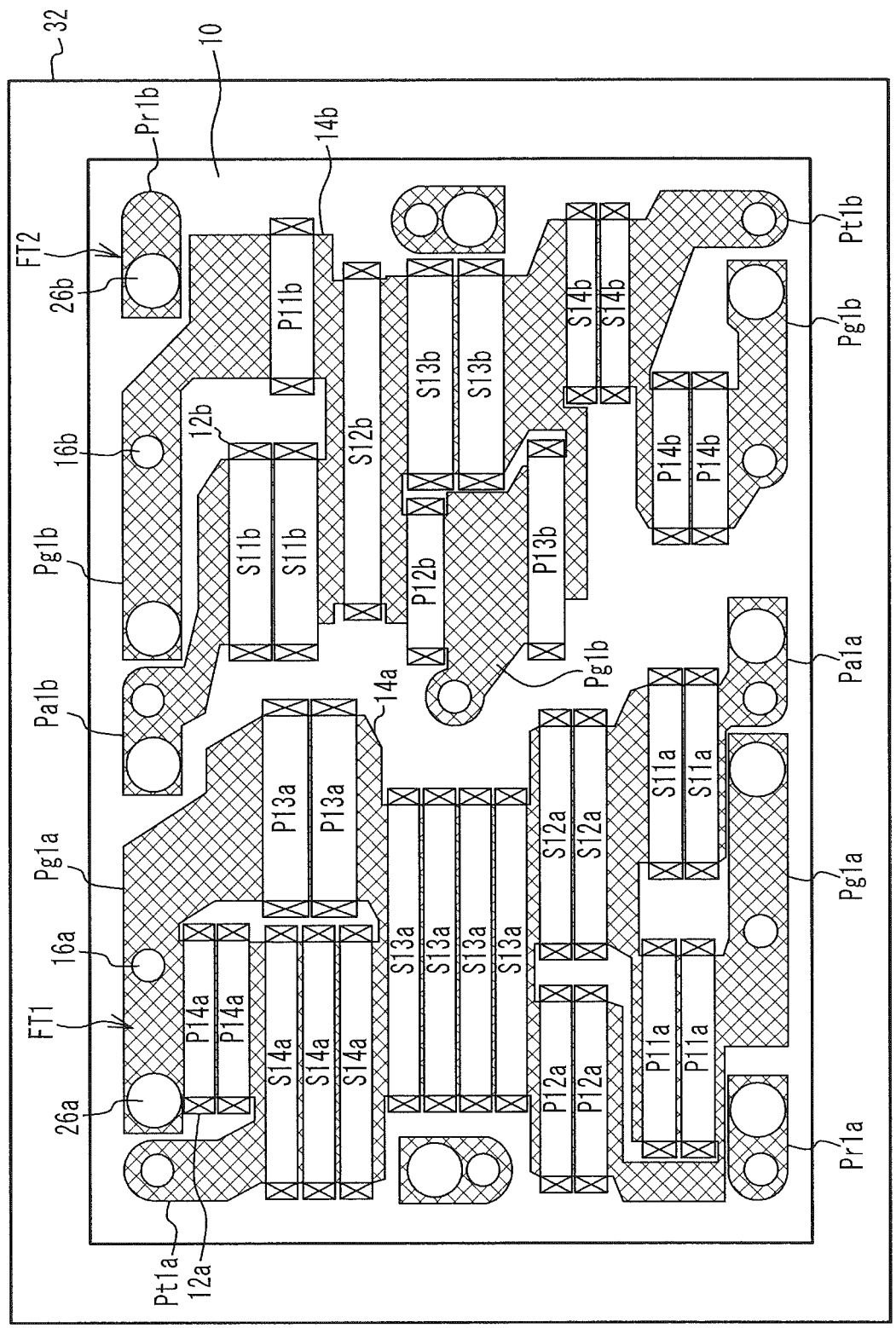
FIG. 19 is a plan view of the upper surface of the substrate 10 in the second embodiment.

FIG. 19 is a plan view of the upper surface of the substrate 10 in the second embodiment. As illustrated in FIG. 19, the transmit filter FT1 is formed of the acoustic wave resonators 12a and the wiring lines 14a located on the upper surface of the substrate 10, and the transmit filter FT2 is formed of the acoustic wave resonators 12b and the wiring lines 14b located on the upper surface of the substrate 10. The transmit filter FT1 is a ladder-type filter having the series resonators S11a through S14a and the parallel resonators P11a through P14a. The transmit filter FT2 is a ladder-type filter having the series resonators S11b through S14b and the parallel resonators P11b through P14b. The pad Pa1a of the transmit filter FT1 and the pad Pa1b of the transmit filter FT2 are located in the vicinity of the respective centers of the opposed sides of the substrate 10. Other structures are the same as those of the first embodiment illustrated in FIG. 4, and the description thereof is thus omitted.

Figure 20:
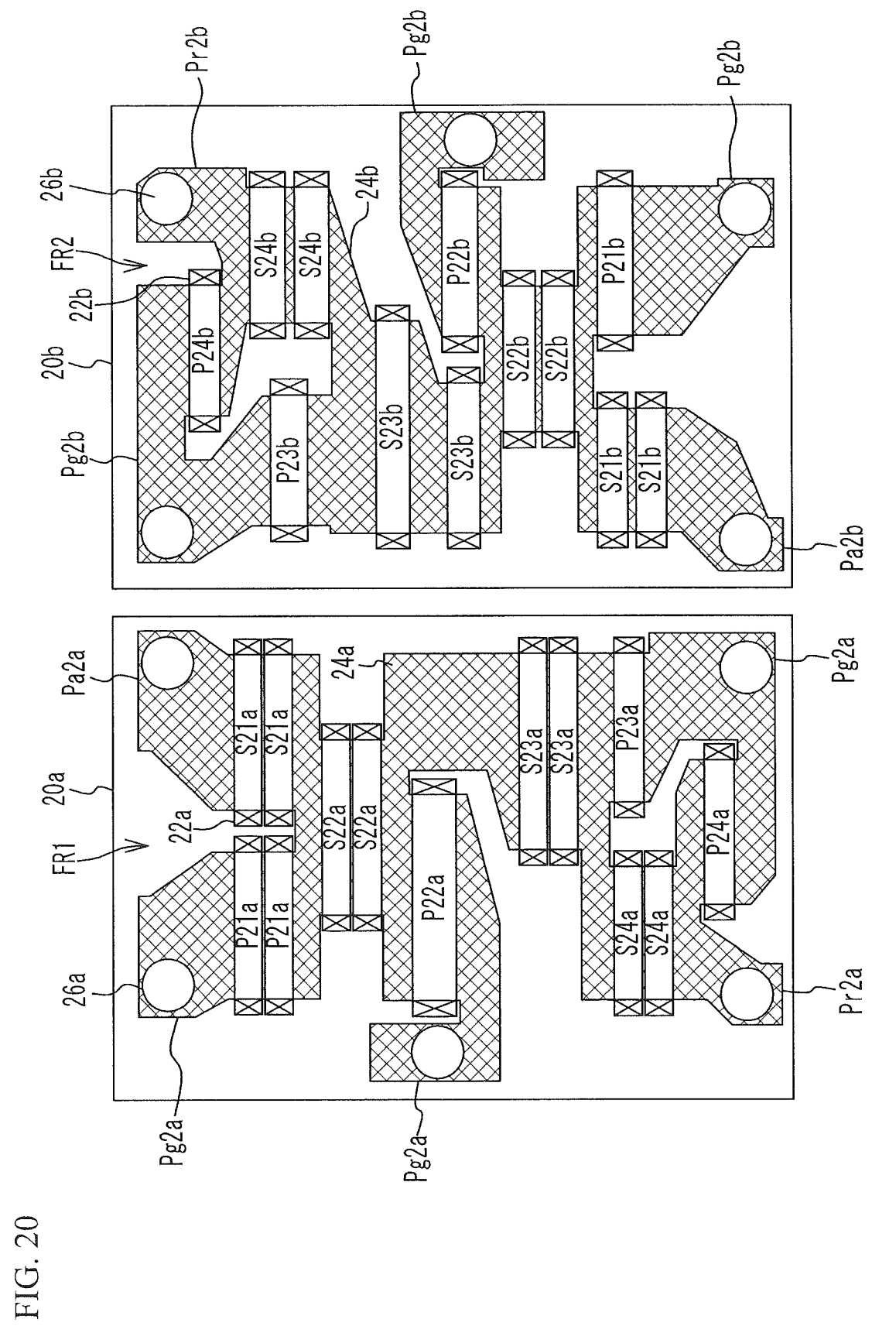
FIG. 20 is a plan view of the lower surfaces of the substrates 20a and 20b in the second embodiment as transparently viewed from above.

FIG. 20 is a plan view of the lower surfaces of the substrates 20a and 20b in the second embodiment as transparently viewed from above. As illustrated in FIG. 20, the receive filter FR1 is formed of the acoustic wave resonators 22a and the wiring lines 24a located on the lower surface of the substrate 20a, and the receive filter FR2 is formed of the acoustic wave resonators 22b and the wiring lines 24b located on the lower surface of the substrate 20b. The receive filter FR1 is a ladder-type filter having series resonators S21a through S24a and parallel resonators P21a through P24a. The receive filter FR2 is a ladder-type filter having the series resonators S21b through S24b and the parallel resonators P21b through P24b. Other structures are the same as those of the first variation of the first embodiment illustrated in FIG. 9, and the description thereof is thus omitted.

Figure 21:
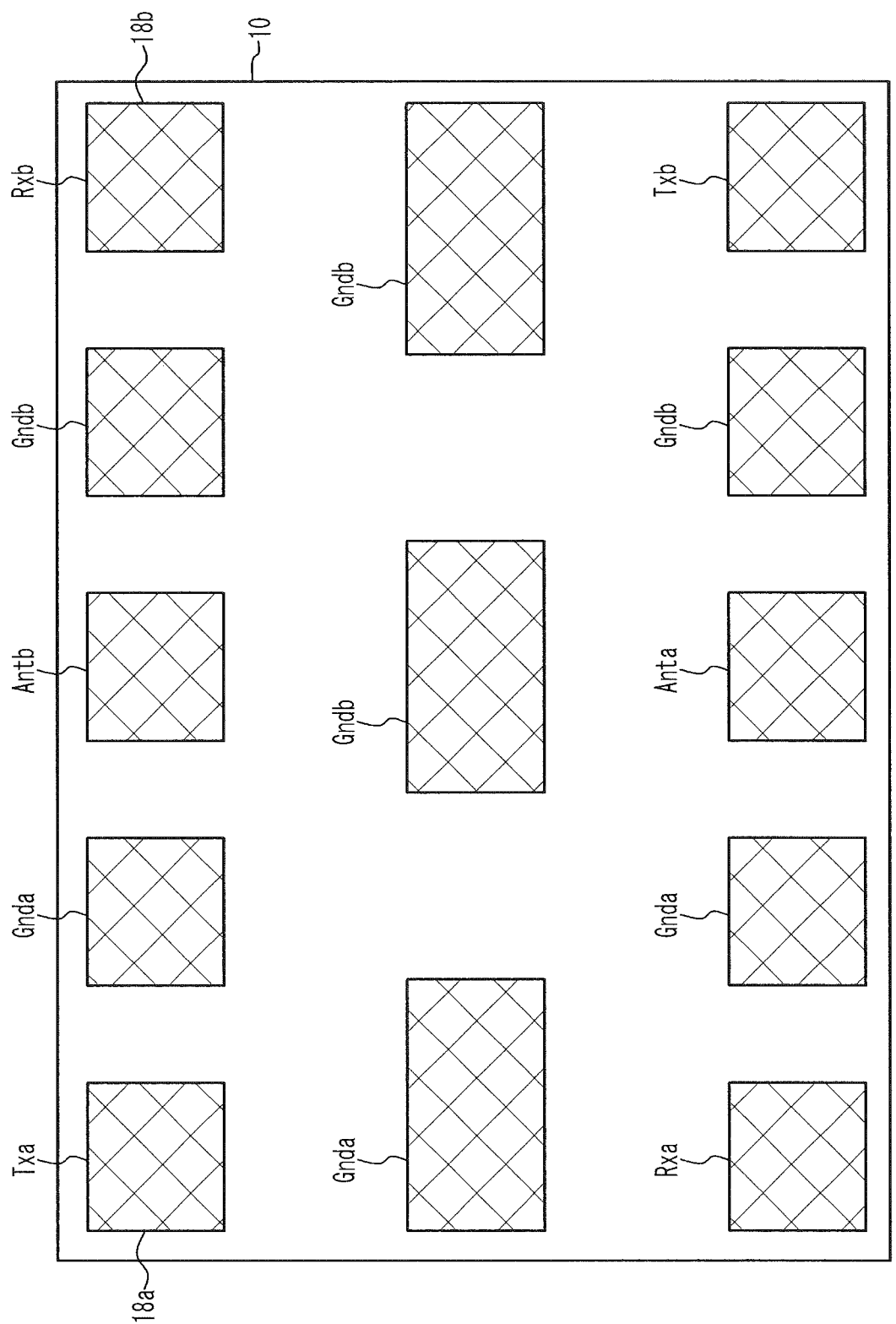
FIG. 21 is a plan view of the lower surface of the substrate 10 in the second embodiment as transparently viewed from above.

FIG. 21 is a plan view of the lower surface of the substrate 10 in the second embodiment as transparently viewed from above. As illustrated in FIG. 21, the common terminals Anta and Antb, the transmit terminals Txa and Txb, the receive terminals Rxa and Rxb, and the ground terminals Gnda and Gndb are located on the lower surface of the substrate 10. The common terminal Ant1 in FIG. 17 corresponds to the common terminals Anta and Antb that are connected in the mount board 60. The transmit terminals Tx1 and Tx2 respectively correspond to the transmit terminals Txa and Txb. The receive terminals Rx1 and Rx2 in FIG. 17 respectively correspond to the receive terminals Rxa and Rxb. Other structures are the same as those of the first embodiment illustrated in FIG. 6, and the description thereof is thus omitted.

Figure 22:
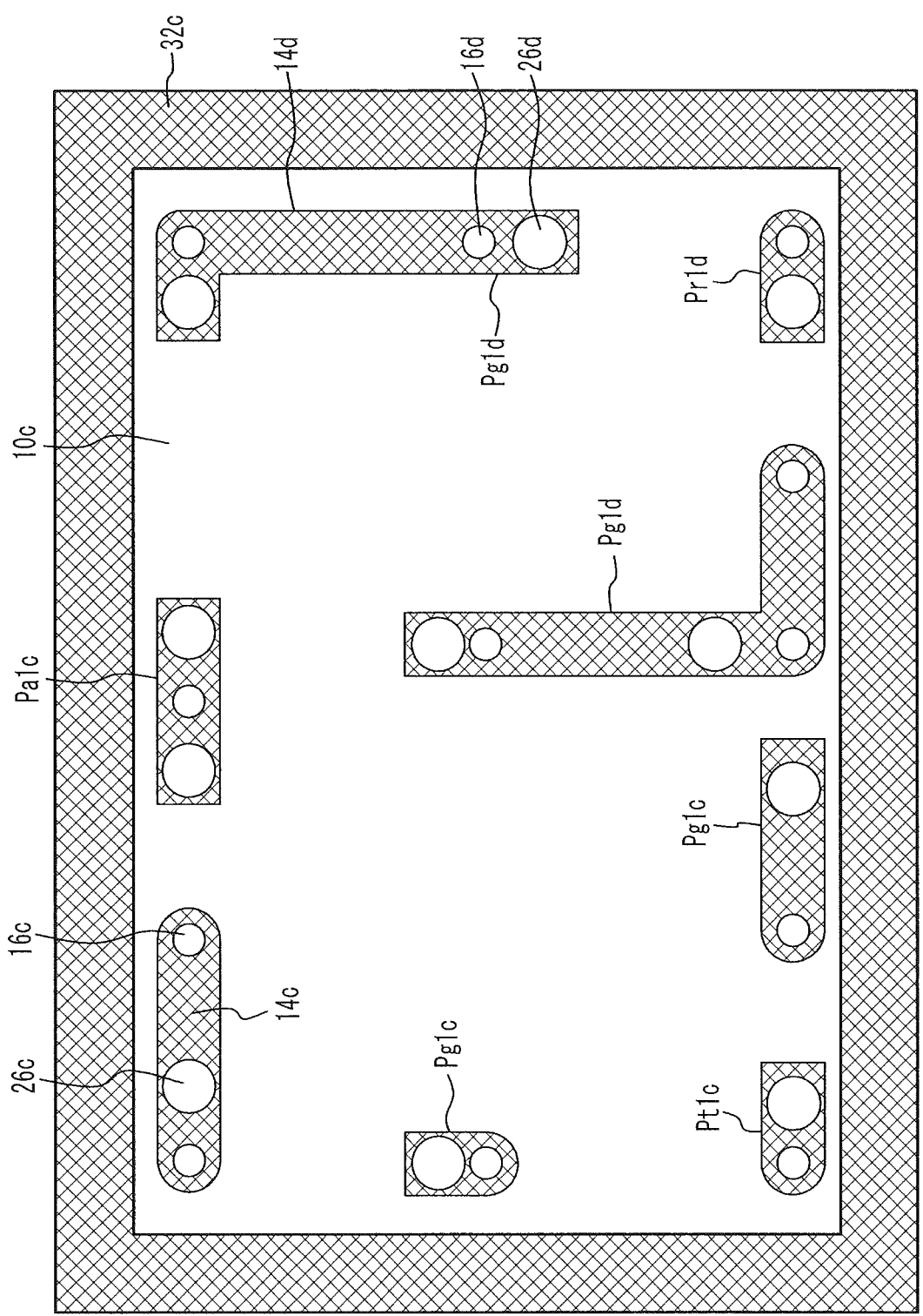
FIG. 22 is a plan view of the upper surface of a substrate 10c in the second embodiment.

FIG. 22 is a plan view of the upper surface of the substrate 10c in the second embodiment. As illustrated in FIG. 22, no acoustic wave resonator is located on the upper surface of the substrate 10c, and the wiring lines 14c and 14d and the ring-shaped electrode 32c are located on the upper surface of the substrate 10c. The wiring lines 14c include pads Pa1c, Pt1c, and Pg1c, and the wiring lines 14d include pads Pr1d and Pg1d. The via wiring 16c and the bump 26c are coupled to the wiring line 14c, and the via wiring 16d and the bump 26d are coupled to the wiring line 14d. Other structures are the same as those of the FIG. 19, and the description thereof is thus omitted.

Figure 23:
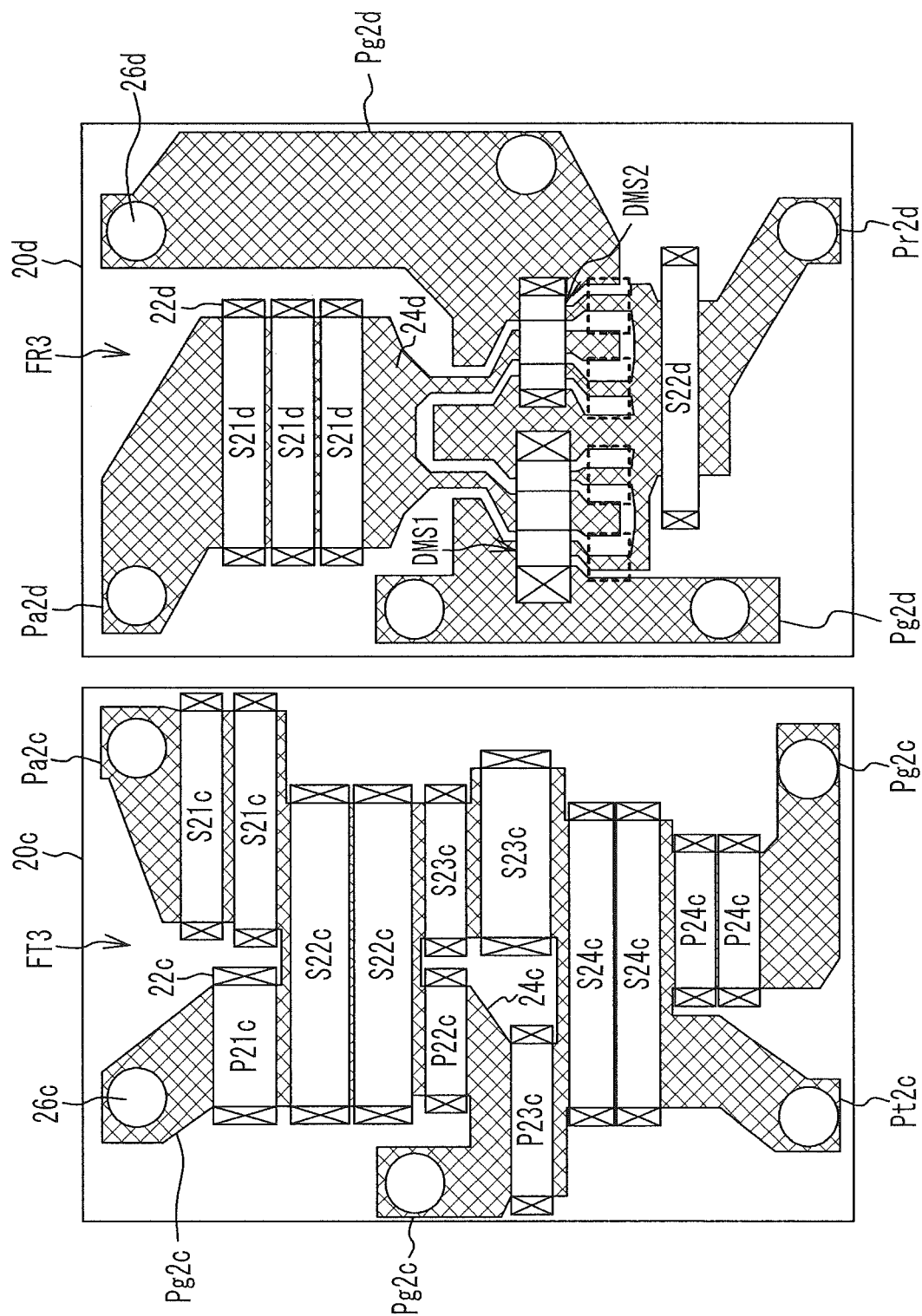
FIG. 23 is a plan view of the lower surfaces of substrates 20c and 20d in the second embodiment as transparently viewed from above.

FIG. 23 is a plan view of the lower surfaces of the substrates 20c and 20d in the second embodiment as transparently viewed from above. As illustrated in FIG. 23, the transmit filter FT3 is formed of the acoustic wave resonators 22c and the wiring lines 24c located on the lower surface of the substrate 20c, and the receive filter FR3 is formed of the acoustic wave resonators 22d and the wiring lines 24d located on the lower surface of the substrate 20d. The transmit filter FT3 is connected between the pads Pa2c and Pt2c, and is a ladder-type filter having series resonators S21c through S24c and parallel resonators P21c through P24c. The receive filter FR3 includes series resonators S21d and S22d, and the multimode type filters DMS1 and DMS2. The pads Pa2c and Pa2d are coupled to the pad Pa1c on the substrate 10c. Other structures are the same as those of the FIG. 20, and the description thereof is thus omitted.

Figure 24:
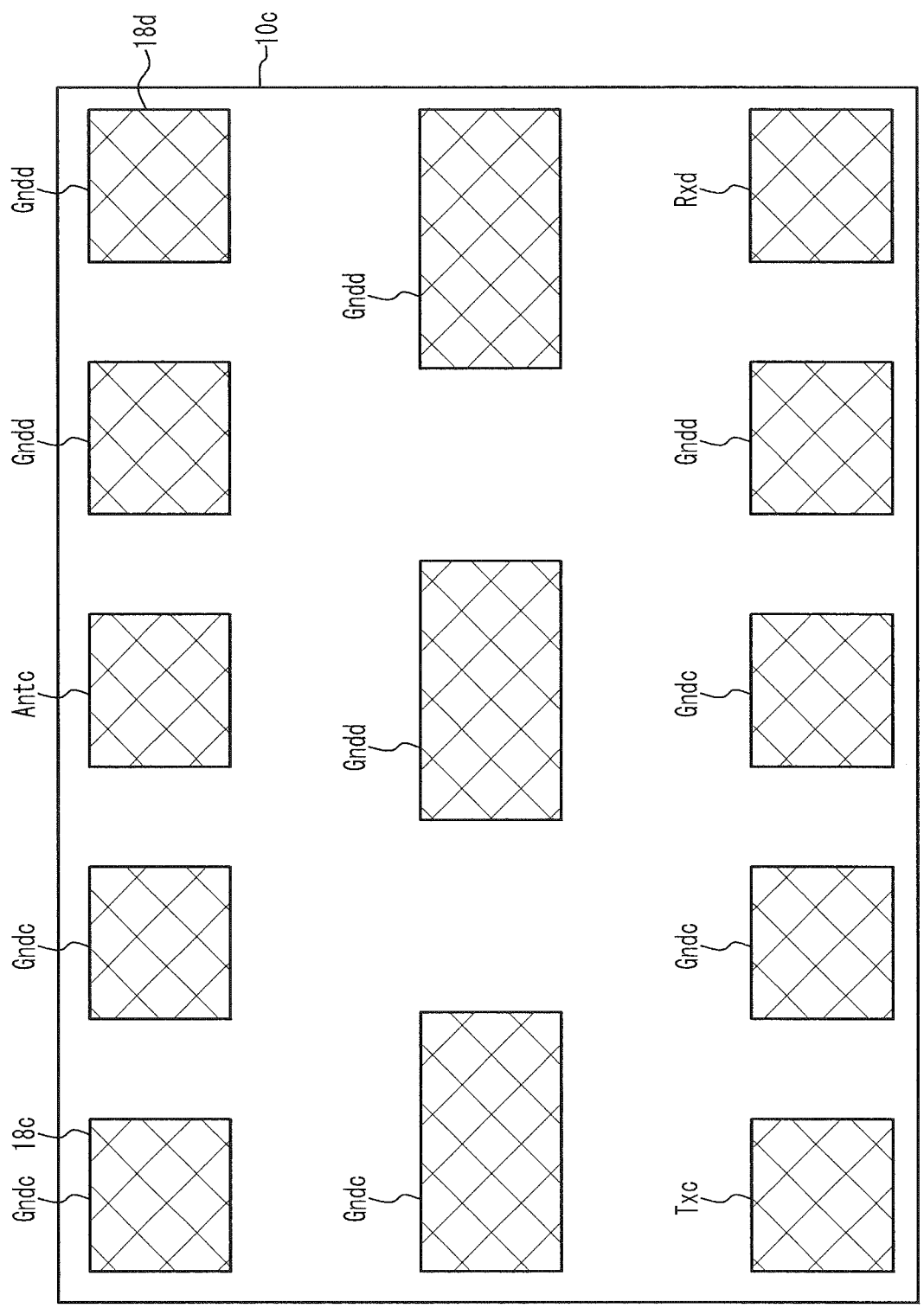
FIG. 24 is a plan view of the lower surface of the substrate 10c in the second embodiment as transparently viewed from above.

FIG. 24 is a plan view of the lower surface of the substrate 10c in the second embodiment as transparently viewed from above. As illustrated in FIG. 24, the terminals 18c and 18d are located on the lower surface of the substrate 10c. The terminals 18c include a common terminal Antc, a transmit terminal Txc, and a ground terminal Gndc, and the terminals 18d include a receive terminal Rxd and a ground terminal Gndd. The common terminal Ant1, the transmit terminal Tx3, and the receive terminal Rx3 in FIG. 17 respectively correspond to the common terminal Antc, the transmit terminal Txc, and the receive terminal Rxd. Other structures are the same as those in FIG. 21, and the description thereof is thus omitted.

In the second embodiment, as illustrated in FIG. 18 through FIG. 21, the transmit filter FT1 and the receive filter FR1 of the quadplexer Qud1 face each other across the air gap 28a, and the transmit filter FT2 and the receive filter FR2 of the quadplexer Qud1 face each other across the air gap 28b. As illustrated in FIG. 18 and FIG. 22 through FIG. 24, the transmit filter FT3 and the receive filter FR3 of the duplexer Dup3 face none of the other filters.

Second Comparative Example

Figure 25:
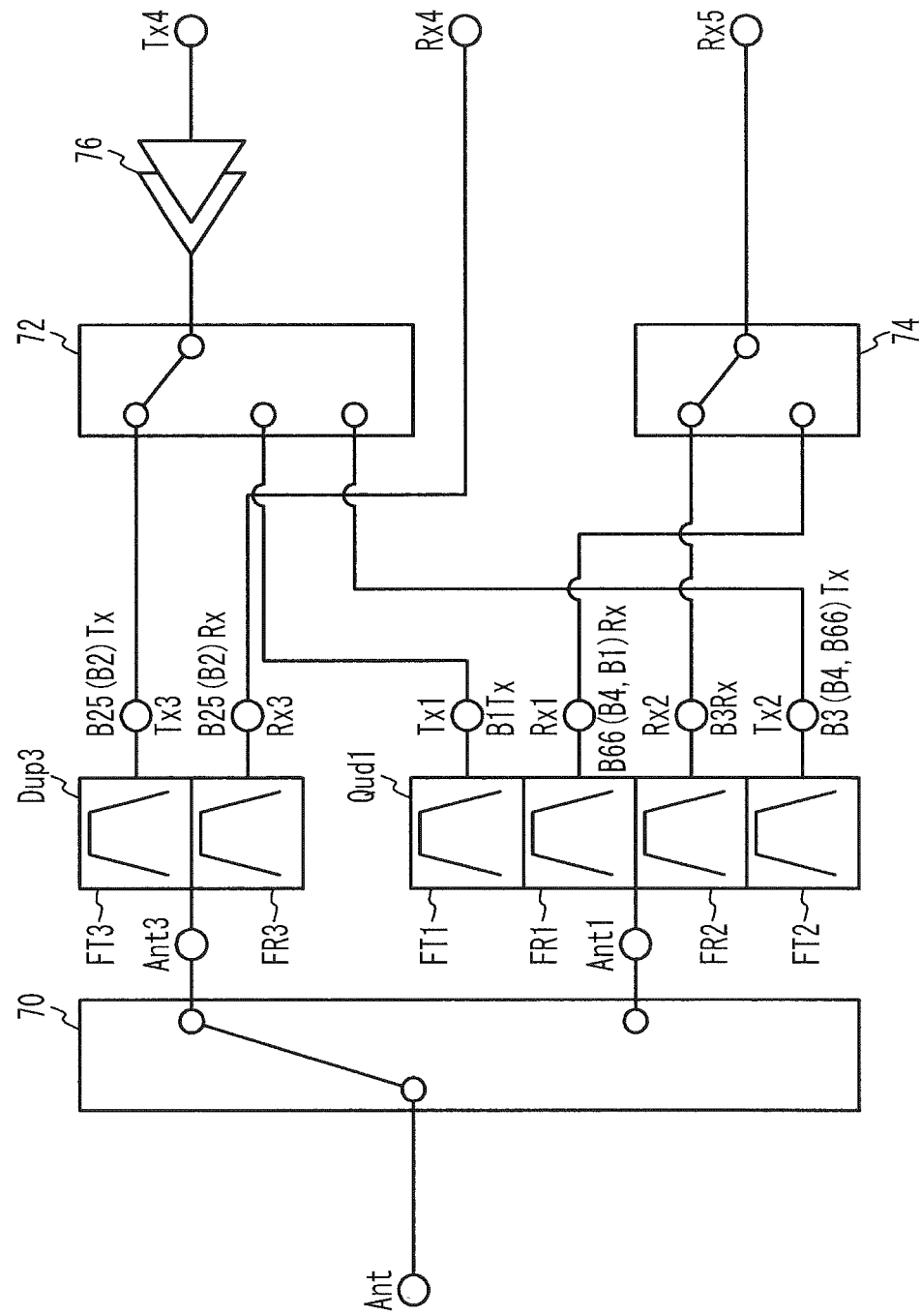
FIG. 25 is a block diagram of a communication module in accordance with a second comparative example.

FIG. 25 is a block diagram of a communication module in accordance with a second comparative example. As illustrated in FIG. 25, the transmit filters FT1, FT2, and FT3 are respectively for B1Tx, B3Tx (B4Tx, B66Tx), and B25Tx (B2Tx). The receive filters FR1, FR2, and FR3 are respectively for B66Rx (B4Rx, B1Rx), B3Rx, and B25Rx (B2Rx). Other structures are the same as those of the second embodiment in FIG. 17, and the description thereof is thus omitted.

Figure 26:
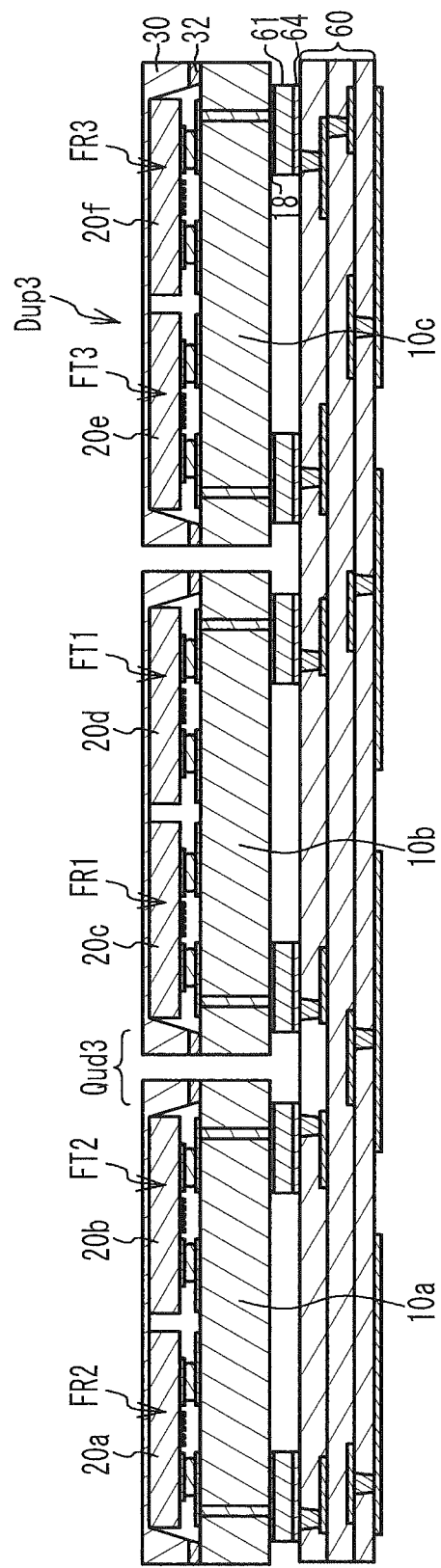
FIG. 26 is a cross-sectional view of the communication module in accordance with the second comparative example.

FIG. 26 is a cross-sectional view of the communication module in accordance with the second comparative example. As illustrated in FIG. 26, the substrates 10a and 10b are mounted, as a quadplexer Qud3, on the mount board 60, and the substrate 10c is mounted as the duplexer Dup3. The substrate 20a having the receive filter FR2 located on the lower surface thereof and the substrate 20b having the transmit filter FT2 located on the lower surface thereof are mounted on the substrate 10a. The substrate 20c having the receive filter FR1 located on the lower surface thereof and the substrate 20d having the transmit filter FT1 located on the lower surface thereof are mounted on the substrate 10b. A substrate 20e having the transmit filter FT3 located on the lower surface thereof and a substrate 20f having the receive filter FR3 located on the lower surface thereof are mounted on the substrate 10c.

In the second comparative example, each filter faces none of the other filters. Thus, the interference between filters is reduced. However, the reduction in size of the module is difficult. For example, in the second embodiment, the interference between filters is reduced and the size reduction is possible by stacking the filters that are less likely to be used at the same time. For example, when the dimensions in plan view of the substrates 10 and 10a through 10c are configured to be 1.7 mm×1.3 mm, a gap of 0.15 mm is provided between the substrates 10 and 10c in the second embodiment, and a gap of 0.15 mm is provided between the substrates 10a and 10b and between the substrates 10b and 10c in the second comparative example, the area of the module in plan view is 7.08 mm² in an example of the second comparative example, and is 4.75 mm² in an example of the second embodiment. As described above, the area in the example of the second embodiment is approximately 67% of the area in the example of the second comparative example.

First Variation of the Second Embodiment

Figure 27:
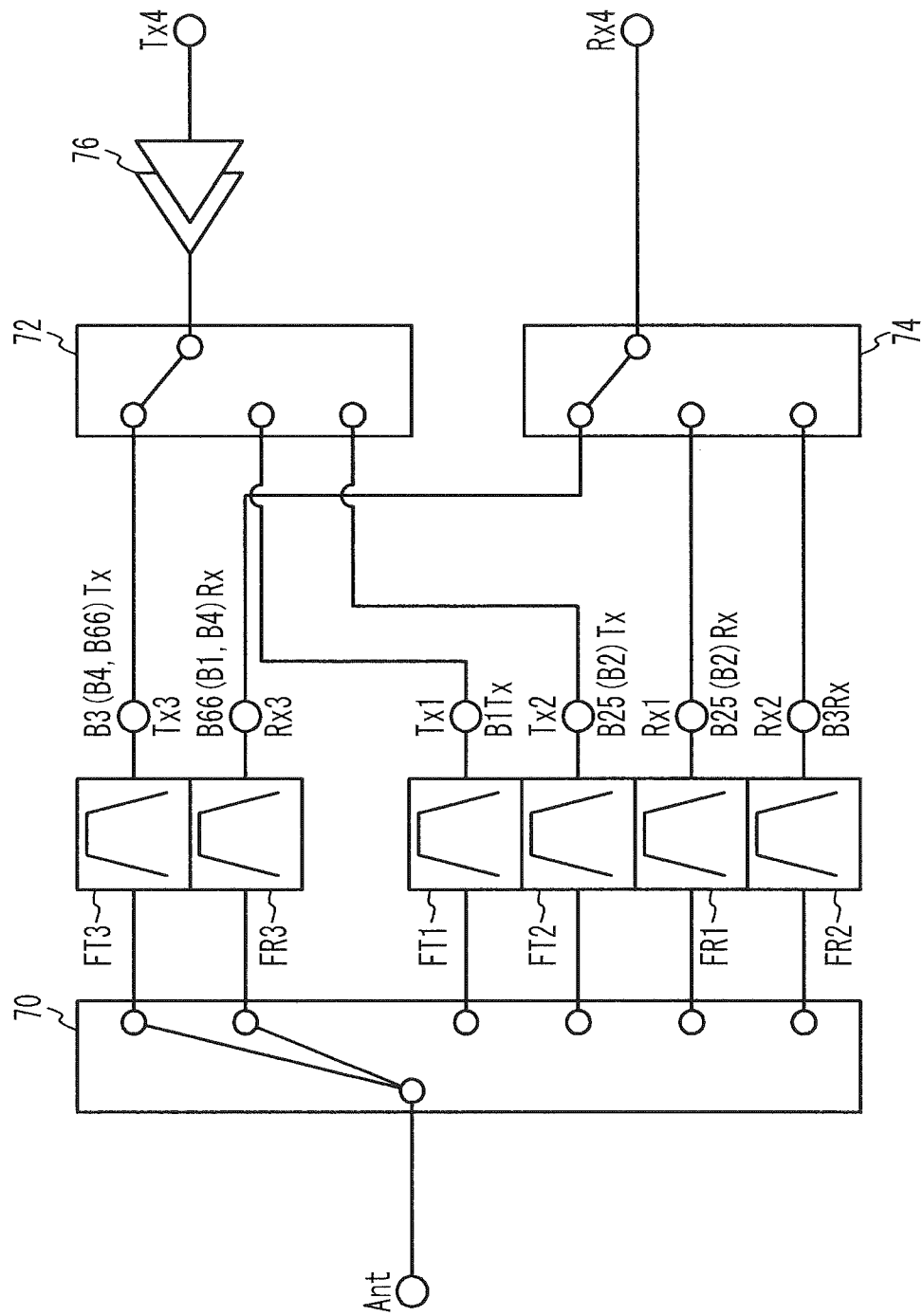
FIG. 27 is a block diagram of a communication module in accordance with a first variation of the second embodiment.

FIG. 27 is a block diagram of a communication module in accordance with a first variation of the second embodiment. As illustrated in FIG. 27, none of the common terminals Ant1 and Ant3 are provided, and each filter is directly connected to the switch 70. The switch 70 connects at least one of the filters to the antenna terminal Ant. The switch 72 connects at least one of the transmit terminals Tx1 through Tx3 to the power amplifier 76. The switch 74 connects at least one of the receive terminals Rx1 through Rx3 to the receive terminal Rx4. Other structures are the same as those of the second embodiment, and the description thereof is thus omitted. As in the first variation of the second embodiment, the common terminals Ant1 and Ant3 may not necessarily be provided.

As in the second embodiment and the variations thereof, the transmit filter FT1 (a first filter) is located on the upper surface (a first surface) of the substrate 10. The receive filter FR1 (a second filter) is located on the lower surface (a second surface) of the substrate 20a. In the stacking direction, at least a part of the transmit filter FT1 overlaps with at least a part of the receive filter FR1, and the transmit filter FT1 and the receive filter FR1 are not used for communication at the same time. Accordingly, the interference between the filters used for communication at the same time is reduced, and the size is reduced.

The transmit filter FT2 (a third filter) is located on the upper surface (a third surface) of the substrate 10. The receive filter FR2 (a fourth filter) is located on the lower surface (a fourth surface) of the substrate 20b. In the stacking direction, at least a part of the transmit filter FT2 overlaps with at least a part of the receive filter FR2, and the transmit filter FT2 and the receive filter FR2 are not used for communication at the same time. Thus, the interference between the filters used for communication at the same time is reduced, and the size is reduced. The first surface on which the first filter is located and the third surface on which the third filter is located may be the same surface of a single substrate, or may be the surfaces of different substrates. The second surface on which the second filter is located and the fourth surface on which the fourth filter is located may be the same surface of a single substrate, or may be the surfaces of different substrates.

The receive filter FR1 overlaps with none of the transmit filter FT2 and the receive filter FR2 in the stacking direction, and the receive filter FR2 overlaps with none of the transmit filter FT1 and the receive filter FR1 in the stacking direction. The receive filter FR1 is used for communication at the same time as at least one of the transmit filter FT2 and the receive filter FR2, and/or the receive filter FR2 is used for communication at the same time as at least one of the transmit filter FT1 and the receive filter FR1. As seen above, the interference between the filters used for communication at the same time is reduced by not overlapping the filters used for communication at the same time.

The passband of the transmit filter FT1 is a first communication band, the passband of the receive filter FR1 is a second communication band, the passband of the transmit filter FT2 is a third communication band, and the passband of the receive filter FR2 is a fourth communication band. In this case, the first communication band and the second communication band are not used for carrier aggregation at the same time, and the third communication band and the fourth communication band are not used for carrier aggregation at the same time. Furthermore, the second communication band and either one of the third communication band and the fourth communication band are used for carrier aggregation at the same time, and/or the fourth communication band and either one of the first communication band and the second communication band are used for carrier aggregation at the same time. As seen above, the filters that are not used for carrier aggregation at the same time are configured to overlap, and the filters used for carrier aggregation at the same time are configured not to overlap. This configuration reduces the interference between filters used for communication at the same time, and reduces the size.

The first communication band and the second communication band are not the communication bands of an identical frequency division duplex band, and the third communication band and the fourth communication band are not the communication bands of an identical frequency division duplex band. Furthermore, the second communication band and the other of the third communication band and the fourth communication band are the transmit band and the receive band of an identical frequency division duplex band, and/or the fourth communication band and the other of the first communication band and the second communication band are the transmit band and the receive band of an identical frequency division duplex band. As described above, the filters that are not used for transmission and reception at the same time are configured to overlap, and the filters used for transmission and reception at the same time are configured not to overlap. This configuration reduces the interference between the filters used for communication at the same time, and reduces the size.

Although the embodiments of the present invention have been described in detail, it is to be understood that the various change, substitutions, and alterations could be made hereto without departing from the spirit and scope of the invention.

What is claimed is:

1. A communication module comprising:
   a first substrate having a first surface;
   a second substrate having a second surface, the second surface facing the first surface across an air gap;
   a third substrate having a third surface, the third surface facing the first surface across an air gap;
   a first filter located on the first surface, a passband of the first filter being a transmit band of a first band, the first band being a frequency division duplex band;
   a second filter located on the second surface, at least a part of the second filter overlapping with at least a part of the first filter in a stacking direction in which the first substrate and the second substrate are stacked, a passband of the second filter being a receive band of a second band, the second band differing from the first band and being a frequency division duplex band;
   a third filter located on the first surface, the third filter not overlapping with the second filter in the stacking direction, a passband of the third filter being the transmit band of the second band; and
   a fourth filter located on the third surface, at least a part of the fourth filter overlapping with at least a part of the third filter in the stacking direction, the fourth filter not overlapping with the first filter, a passband of the fourth filter being the receive band of the first band.

2. The communication module according to claim 1, wherein
the first filter and the second filter are not used for communication at the same time.

3. The communication module according to claim 1, wherein
at least a part of a ground terminal of the first filter and at least a part of a ground terminal of the second filter are electrically connected on at least one of the first surface and the second surface.

4. A communication module comprising:
a first substrate having a first surface;
a second substrate having a second surface, the second surface facing the first surface across an air gap;
a third substrate having a third surface;
a fourth substrate having a fourth surface, the fourth surface facing the third surface across an air gap;
a first filter located on the first surface, a passband of the first filter being a transmit band and of a first band, the first band being a frequency division duplex band;
a second filter located on the second surface, at least a part of the second filter overlapping with at least a part of the first filter in a stacking direction in which the first substrate and the second substrate are stacked, a passband of the second filter being a receive band of a second band, the second band differing from the first band, the second band being a frequency division duplex band;
a third filter located on the third surface, a passband of the third filter being the receive band of the first band; and
a fourth filter located on the fourth surface, at least a part of the fourth filter overlapping with at least a part of the third filter in a stacking direction in which the third substrate and the fourth substrate are stacked, a passband of the fourth filter being the transmit band of the second band, wherein
the stacking direction in which the first surface and the second surface are stacked and the stacking direction in which the third surface and the fourth surface are stacked are an identical stacking direction,
the second filter overlaps with none of the third filter and the fourth filter in the identical stacking direction, and
the fourth filter overlaps with none of the first filter and the second filter in the identical stacking direction.

5. The communication module according to claim 4, wherein
the first filter and the second filter are not used for communication at the same time.

6. The communication module according to claim 4, wherein
at least a part of a ground terminal of the first filter and at least a part of a ground terminal of the second filter are electrically connected on at least one of the first surface and the second surface.

7. A communication module comprising:
a first filter located on a first surface;
a second filter located on a second surface, the second surface facing the first surface across an air gap, at least a part of the second filter overlapping with at least a part of the first filter in a stacking direction in which the first surface and the second surface are stacked, the second filter being not used for communication at the same time as the first filter;
a third filter located on a third surface; and
a fourth filter located on a fourth surface, the fourth surface facing the third surface across an air gap, at least a part of the fourth filter overlapping with at least a part of the third filter in a stacking direction in which the third surface and the fourth surface are stacked, the fourth filter being not used for communication at the same time as the third filter, wherein
the stacking direction in which the first surface and the second surface are stacked and the stacking direction in which the third surface and the fourth surface are stacked are an identical stacking direction,
the second filter overlaps with none of the third filter and the fourth filter in the identical stacking direction, and
the fourth filter overlaps with none of the first filter and the second filter in the identical stacking direction.

8. The communication module according to claim 7, wherein
the second filter is used for communication at the same time as at least one of the third filter and the fourth filter, and/or the fourth filter is used for communication at the same time as at least one of the first filter and the second filter.

9. The communication module according to claim 7, wherein
a passband of the first filter is a first communication band, a passband of the second filter is a second communication band, a passband of the third filter is a third communication band, and a passband of the fourth filter is a fourth communication band,
the first communication band and the second communication band are not used for carrier aggregation at the same time, and the third communication band and the fourth communication band are not used for carrier aggregation at the same time, and
the second communication band and either one of the third communication band and the fourth communication band are used for carrier aggregation at the same time, and/or the fourth communication band and either one of the first communication band and the second communication band are used for carrier aggregation at the same time.

10. The communication module according to claim 9, wherein
the first communication band and the second communication band are not communication bands of an identical frequency division duplex band,
the third communication band and the fourth communication band are not communication bands of an identical frequency division duplex band, and
the second communication band and the other of the third communication band and the fourth communication band is a transmit band and a receive band of an identical frequency division duplex band, and/or the fourth communication band and the other of the first communication band and the second communication band are a transmit band and a receive band of a frequency division duplex band.

11. The communication module according to claim 7, further comprising:
a first substrate, the first surface and the third surface being the same surface of the first substrate;
a second substrate having the second surface; and
a third substrate having the fourth surface.

12. The communication module according to claim 7, further comprising:
a first substrate, the first surface and the third surface being the same surface of the first substrate; and
a second substrate, the second surface and the fourth surface being the same surface of the second substrate.

13. The communication module according to claim 7, further comprising:
 a first substrate having the first surface;
 a second substrate having the second surface;
 a third substrate having the third surface; and
 a fourth substrate having the fourth surface.

\* \* \* \* \*